(12) United States Patent
Ju et al.

(10) Patent No.: US 11,050,043 B2
(45) Date of Patent: Jun. 29, 2021

(54) DISPLAY DEVICE AND MANUFACTURING METHOD THEREOF

(71) Applicants: Samsung Display Co., Ltd., Yongin-Si (KR); KOREA UNIVERSITY Research and Business Foundation, Seoul (KR)

(72) Inventors: Byeong-kwon Ju, Seoul (KR); Youngwook Park, Seoul (KR); Cheolhwee Park, Seoul (KR); Youngtak Lee, Hwaseong-si (KR); Jinwoo Park, Yongin-si (KR)

(73) Assignees: Samsung Display Co., Ltd.; KOREA UNIVERSITY Research and Business Foundation

( * ) Notice: Subject to any disclaimer, the term of this patent is extended or adjusted under 35 U.S.C. 154(b) by 0 days.

(21) Appl. No.: 16/657,188

(22) Filed: Oct. 18, 2019

(65) Prior Publication Data

US 2020/0127237 A1    Apr. 23, 2020

(30) Foreign Application Priority Data

Oct. 18, 2018 (KR) .......................... 10-2018-0124549

(51) Int. Cl.
- *H01L 51/52* (2006.01)
- *H01L 51/56* (2006.01)
- *H01L 27/32* (2006.01)

(52) U.S. Cl.
CPC ...... *H01L 51/5268* (2013.01); *H01L 27/3211* (2013.01); *H01L 51/5275* (2013.01); *H01L 51/56* (2013.01); *H01L 2251/308* (2013.01)

(58) Field of Classification Search
CPC . H01L 51/5268; H01L 51/5275; H01L 51/56; H01L 27/3211; H01L 2251/308; H01L 51/5265; H01L 27/3244
See application file for complete search history.

(56) References Cited

U.S. PATENT DOCUMENTS

| | | | |
|---|---|---|---|
| 9,203,052 B2 | 12/2015 | Lee et al. | |
| 2006/0066945 A1* | 3/2006 | Yeo | G02B 3/0031 359/457 |

(Continued)

FOREIGN PATENT DOCUMENTS

| | | |
|---|---|---|
| JP | 2931211 B2 | 8/1999 |
| KR | 10-2009-0129045 A | 12/2009 |

(Continued)

OTHER PUBLICATIONS

Min Chul Suh*, Beom Pyo, Hyung Suk Kim, Dept. of Information Display, Kyung Hee University, Seoul, 130-701, Republic of Korea, "Suppression of the viewing angle dependence by introduction of nanoporous diffuser film on blue OLEDs with strong microcavity effect", Journal "Organic Electronics 28 (2016) 31-38 (8 pages)", © 2015 Elsevier B.V. All rights reserved, homepage: www.elsevier.com/locate/orgel.

*Primary Examiner* — Jarrett J Stark
(74) *Attorney, Agent, or Firm* — Innovation Counsel LLP

(57) ABSTRACT

A display device includes a light emitting element layer and a light scattering layer disposed on the light emitting element layer. The light scattering layer may include a low refractive part that includes a plurality of protruding portions and a high refractive part that covers the protruding portions.

17 Claims, 20 Drawing Sheets

(56) References Cited

U.S. PATENT DOCUMENTS

| | | | | |
|---|---|---|---|---|
| 2012/0249900 A1* | 10/2012 | Koike | ............... | G02F 1/133528 |
| | | | | 349/15 |
| 2012/0286258 A1* | 11/2012 | Naraoka | ................... | C09B 3/02 |
| | | | | 257/40 |
| 2013/0181242 A1* | 7/2013 | Cho | .................... | H01L 51/0096 |
| | | | | 257/98 |
| 2014/0131675 A1* | 5/2014 | Chien | ................. | H01L 51/5275 |
| | | | | 257/40 |
| 2014/0252330 A1* | 9/2014 | Oh | ...................... | H01L 51/5265 |
| | | | | 257/40 |
| 2014/0332798 A1 | 11/2014 | Chen et al. | | |
| 2015/0008424 A1* | 1/2015 | Park | .................... | H01L 51/5268 |
| | | | | 257/40 |
| 2015/0303405 A1* | 10/2015 | Okumura | ............ | H01L 51/5203 |
| | | | | 257/40 |
| 2017/0012244 A1* | 1/2017 | Matsuzaki | .......... | H01L 51/5268 |
| 2017/0207421 A1* | 7/2017 | Matsuzaki | .......... | H01L 51/0096 |
| 2017/0294625 A1* | 10/2017 | Wu | ..................... | H01L 51/5268 |
| 2017/0338443 A1* | 11/2017 | Lee | .................... | H01L 51/5275 |
| 2018/0076410 A1* | 3/2018 | Kagotani | ............ | H01L 51/5209 |
| 2020/0117042 A1* | 4/2020 | Park | .................... | G02F 1/13725 |
| 2020/0203664 A1* | 6/2020 | Ko | ..................... | H01L 51/5212 |

FOREIGN PATENT DOCUMENTS

| | | |
|---|---|---|
| KR | 10-2011-0054841 A | 5/2011 |
| KR | 10-1738727 B1 | 3/2014 |
| KR | 10-2014-0114498 A | 9/2014 |
| KR | 10-1747059 B1 | 7/2017 |

\* cited by examiner

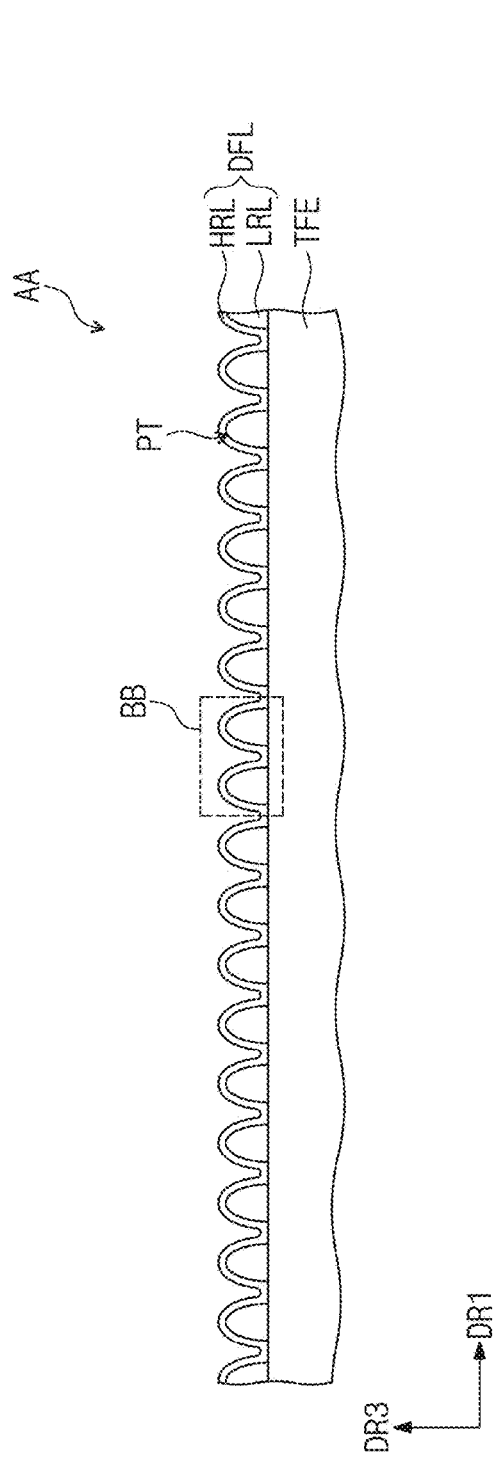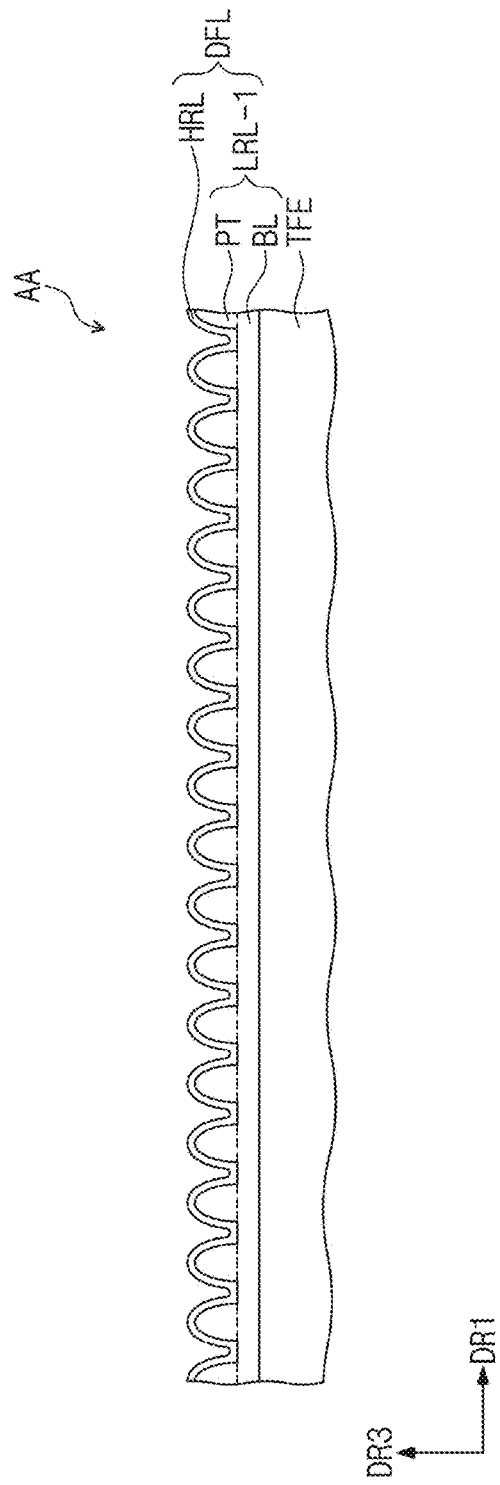

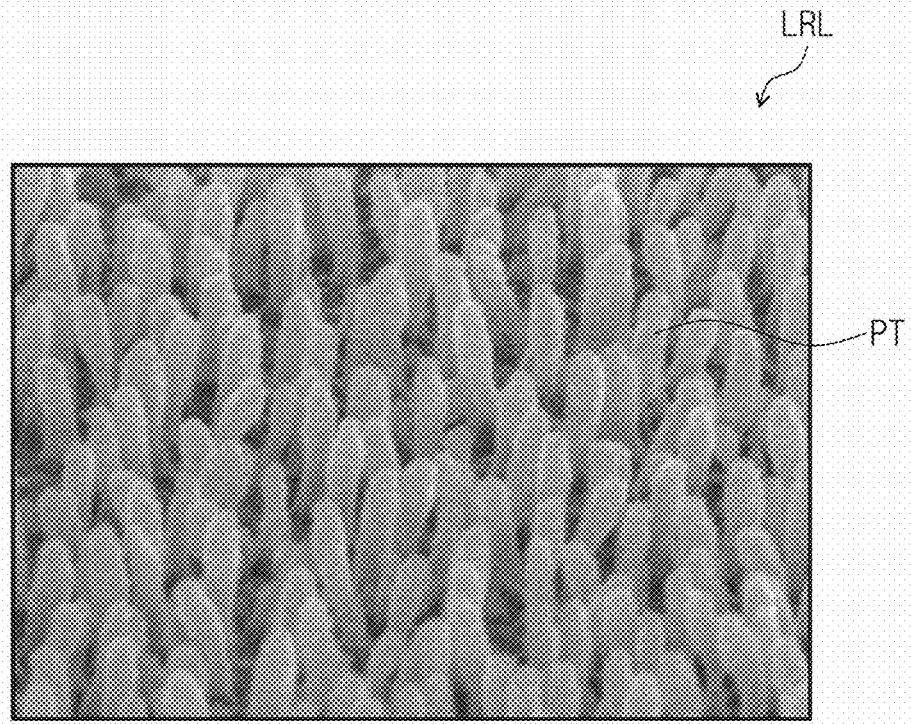

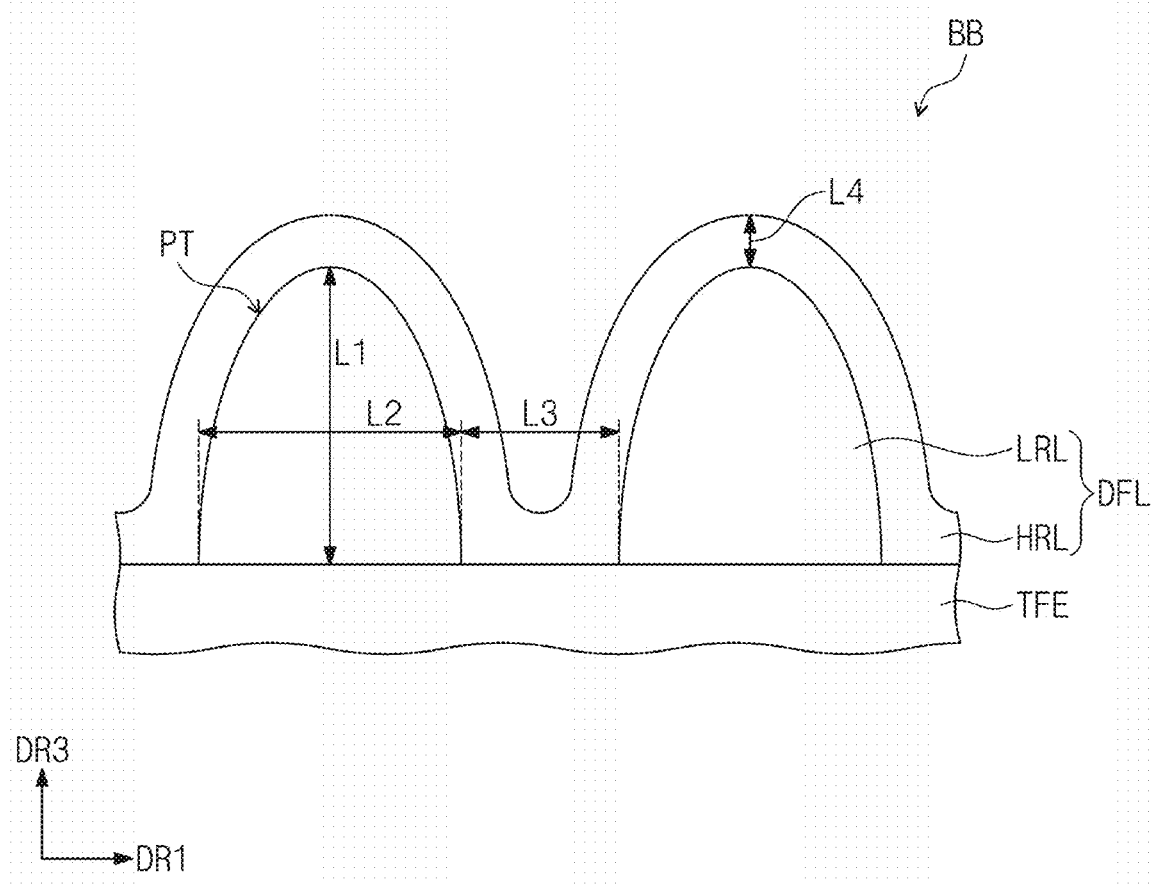

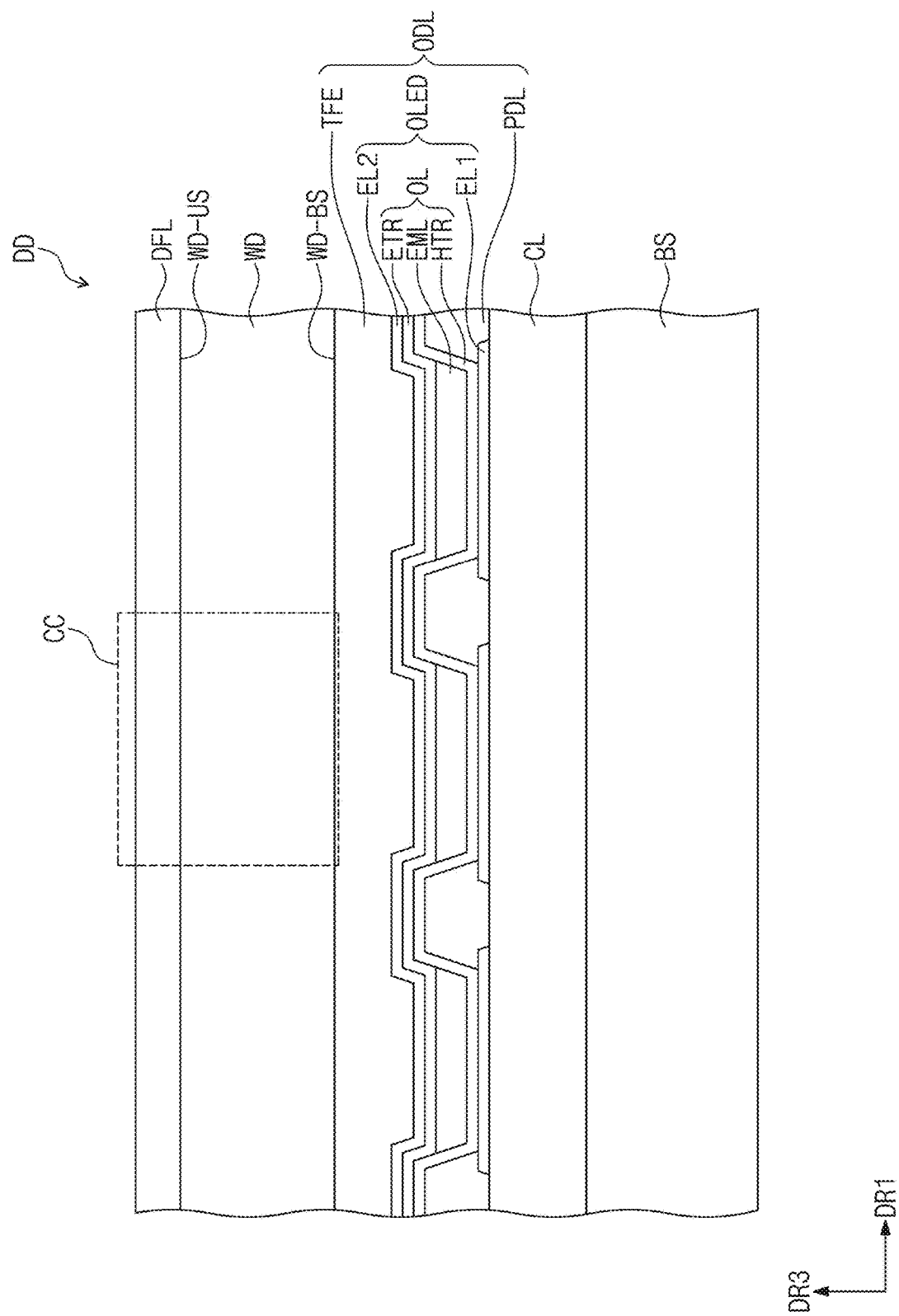

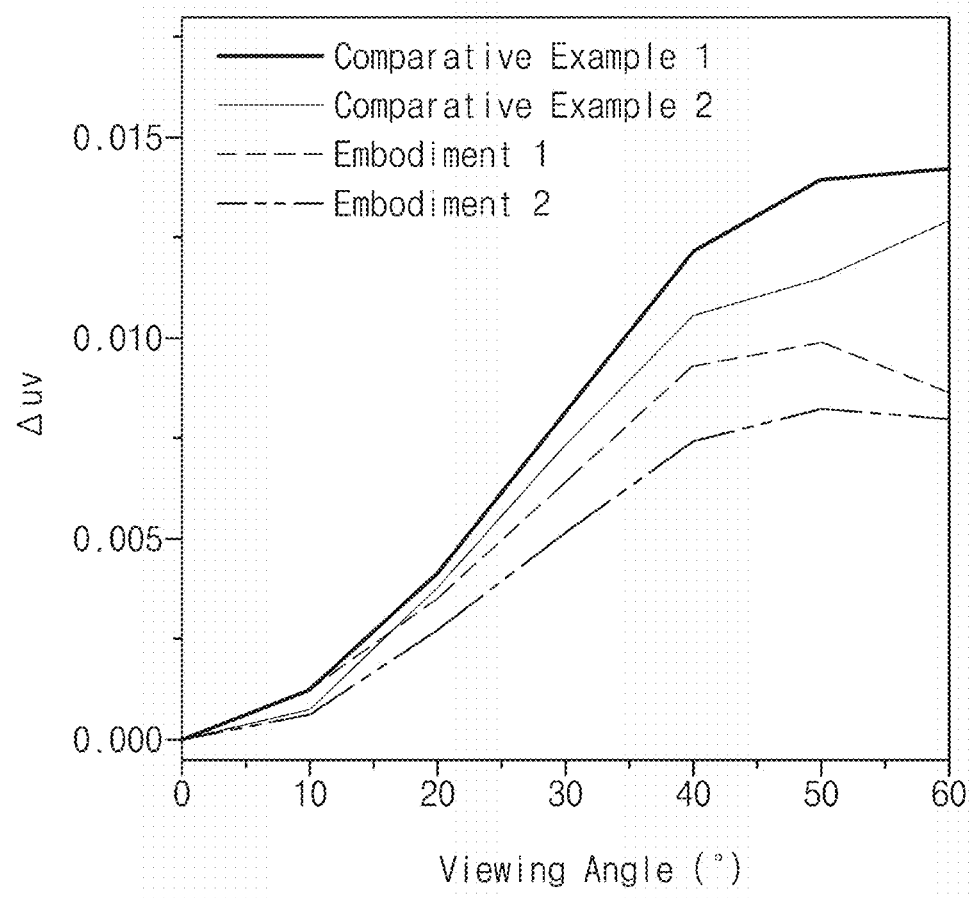

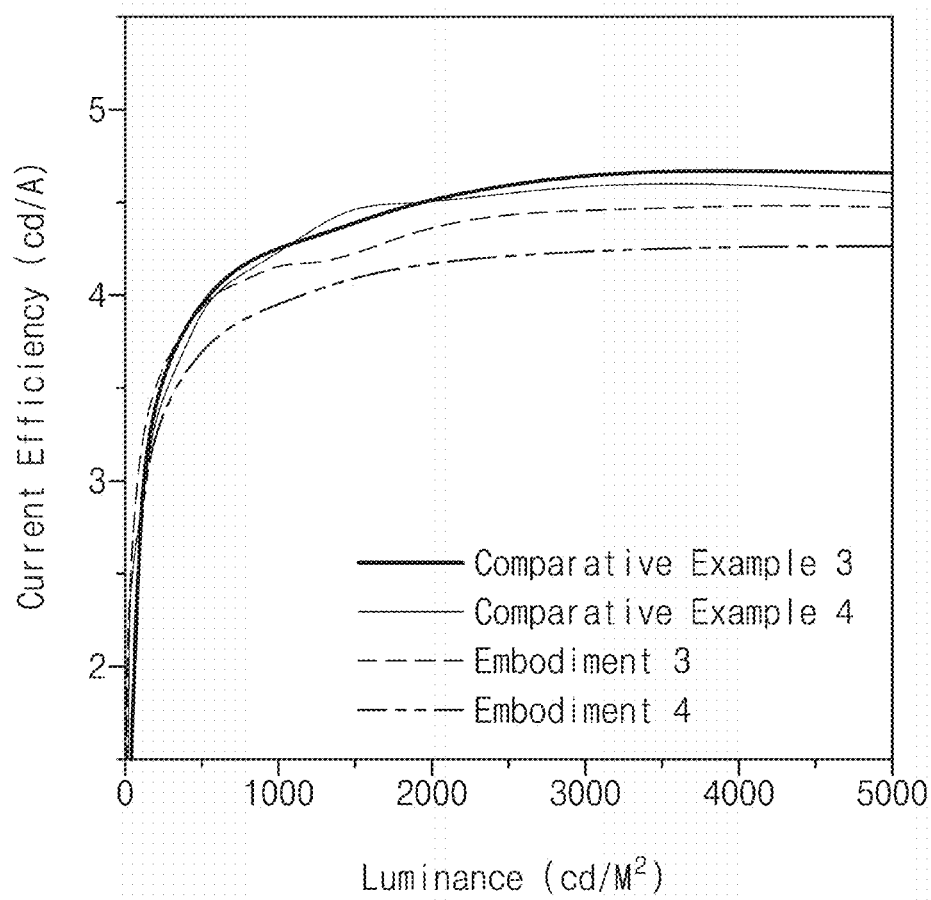

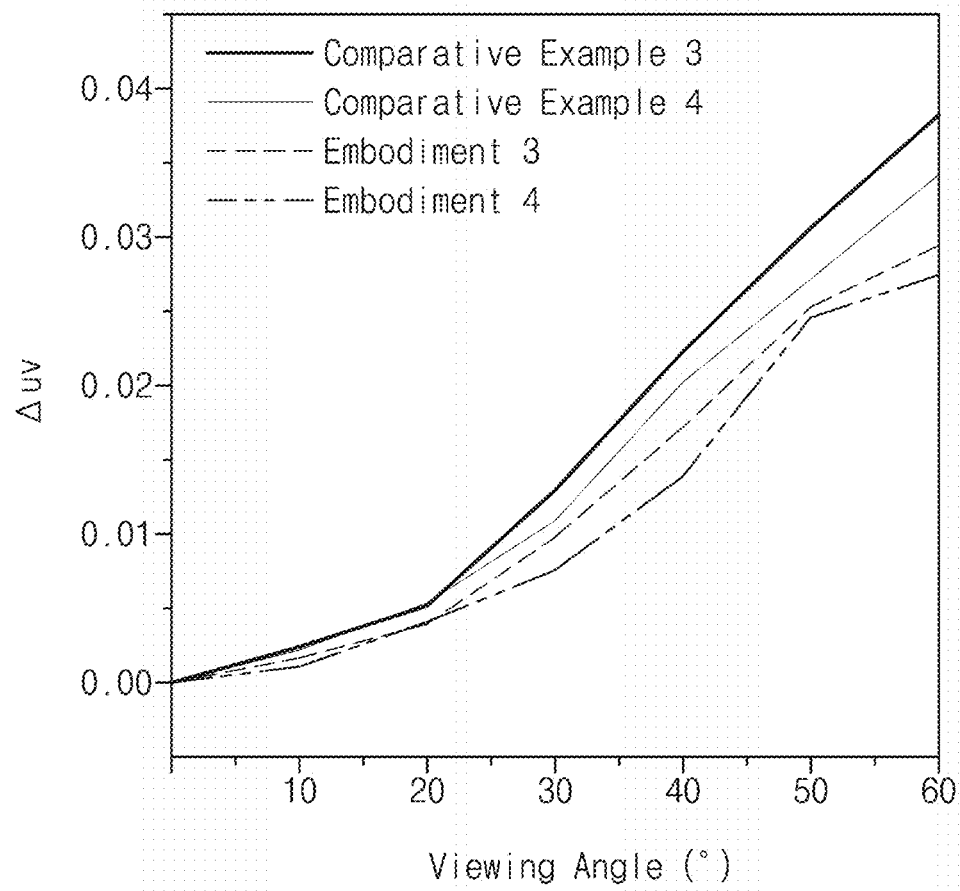

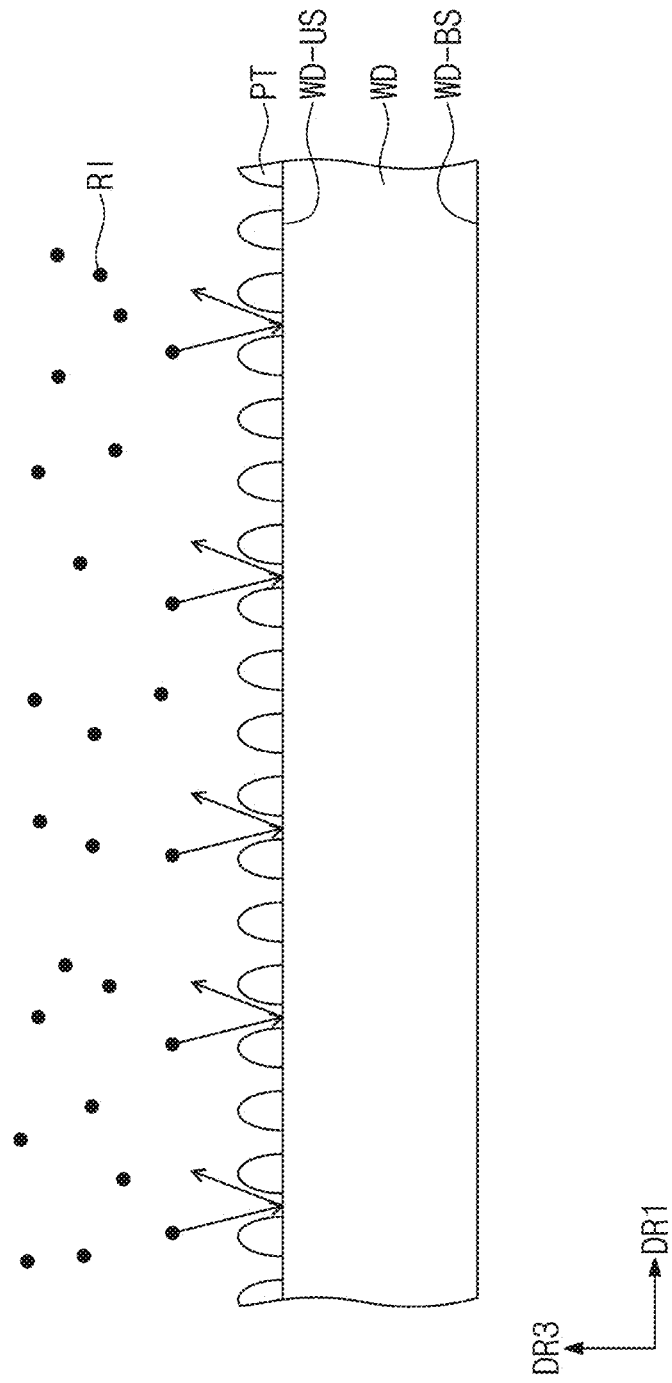

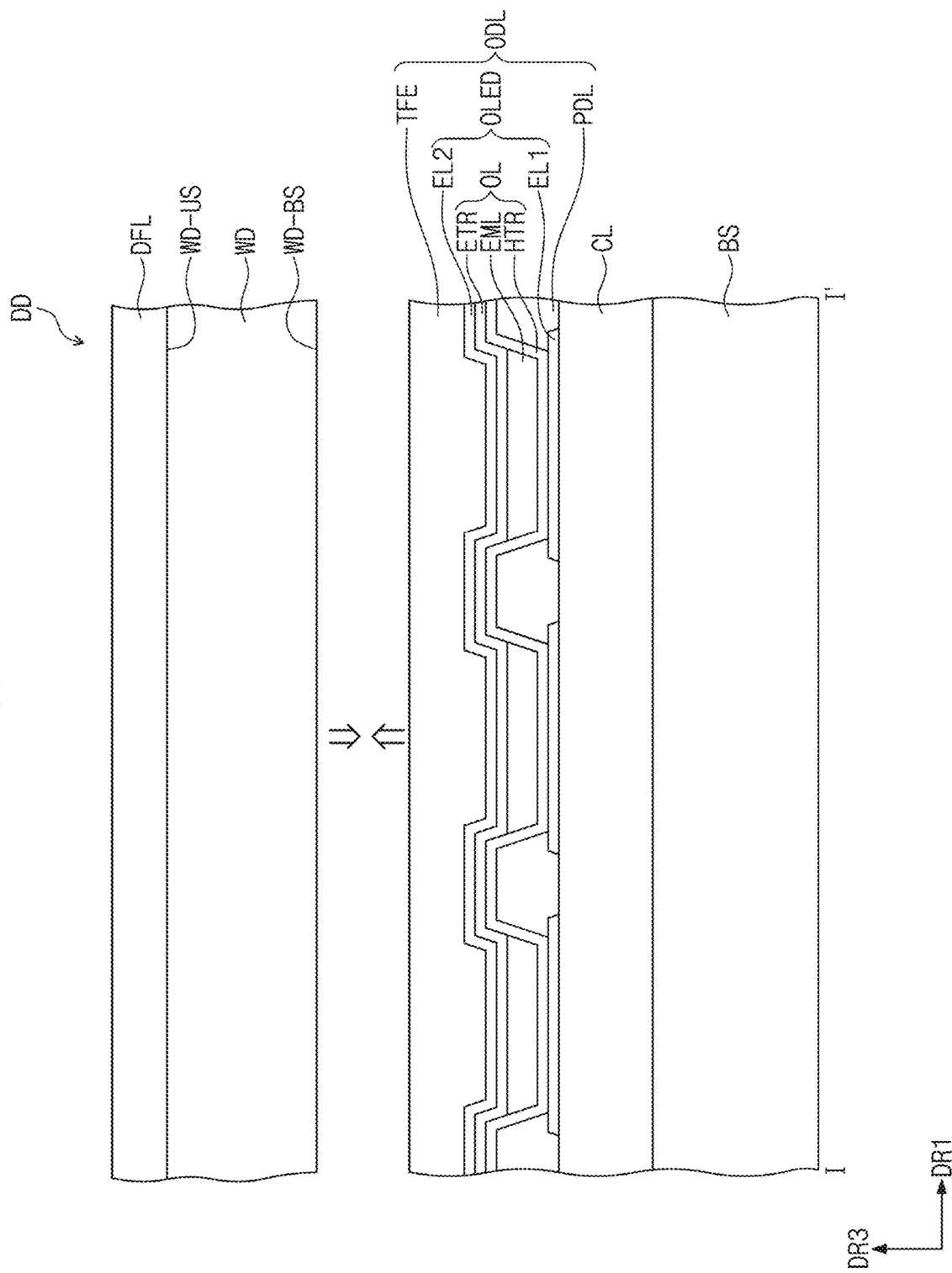

DISPLAY DEVICE AND MANUFACTURING METHOD THEREOF

CROSS-REFERENCE TO RELATED APPLICATIONS

This U.S. non-provisional patent application claims priority under 35 U.S.C. § 119 of Korean Patent Application No. 10-2018-0124549, filed on Oct. 18, 2018, the entire contents of which are hereby incorporated by reference.

BACKGROUND

Various display devices used in multimedia devices such as televisions, mobile phones, tablet computers, navigation units, and game consoles have been developed.

When the display devices are used, a limitation, in which excessive power consumption is generated due to a low efficiency, or visibility is poor due to a narrow viewing angle, has been issued. In recent years, technologies for increasing a light output efficiency and improving a viewing angle of the display device have been actively researched.

SUMMARY

The present disclosure provides a display device capable of improving a light output efficiency of light emitted from a light emitting element and a manufacturing method thereof.

The present disclosure also provides a display device having an improved viewing angle and a manufacturing method thereof.

An embodiment of the inventive concept provides a display device including a light emitting element layer and a light scattering layer. The light emitting element layer includes a plurality of organic light emitting elements and a thin-film encapsulation layer disposed on the organic light emitting elements. The light scattering layer is disposed on the light emitting element layer. The light scattering layer includes: a low refractive part including a plurality of protruding portions and made of a polymer resin; and a high refractive part configured to cover the protruding portions and having a refractive index greater than that of the low refractive part.

In an embodiment, the low refractive part may further include a base part, and each of the protruding portions may protrude in a direction from the base part toward the high refractive part. The low refractive part may have a refractive index of about 1.4 or more and about 1.6 or less, the high refractive part may have a refractive index of about 1.6 or more and about 2.5 or less, and a difference between refractive indexes of the high refractive part and the low refractive part may be about 0.2 or more and about 1 or less.

In an embodiment, the low refractive part may include at least one of poly(methyl methacrylate) (PMMA), SU-8, polyvinyl alcohol (PVA), polyethylene terephthalate (PET), polyethersulfone (PES), and polyethylene naphthalate (PEN), and the high refractive part may include at least one of $Al_2O_3$, MgO, $ZrO_2$, ZnO, $TiO_2$, aluminum zinc oxide (AZO), indium tin oxide (ITO), and indium zinc oxide (IZO).

In an embodiment, the low refractive part may include PMMA, and the high refractive part may include ZnO or $Al_2O_3$.

In an embodiment, each of the protruding portions may have a height of about 200 nm or more and about 500 nm or less, and each of the protruding portions may have a width of about 50 nm or more and about 100 nm or less. The high refractive part may have a thickness of about 20 nm or more and about 100 nm or less. A mean spaced distance between the protruding portions may be about 10 nm or more and about 100 nm or less. The light scattering layer may have a light transmittance of about 80% or more in a wavelength range of about 400 nm or more and about 780 nm.

In an embodiment, the display device may further include a window substrate disposed between the thin-film encapsulation layer and the light scattering layer. The light scattering layer may be directly disposed on a top surface of the window substrate. The low refractive part may have a refractive index equal to or greater than that of the window substrate, and a difference between refractive indexes of the low refractive part and the window substrate may be about 0.2 or less.

In an embodiment, the organic light emitting elements, which are spaced apart from each other on a plane, may include: a first organic light emitting element including a first light emitting layer configured to emit red light; a second organic light emitting element including a second light emitting layer configured to emit green light; and a third organic light emitting element including a third light emitting layer configured to emit blue light. The first to third organic light emitting elements may include first to third resonance layers directly disposed on the first to third light emitting layers, respectively, and each of the first to third resonance layers may have a thickness that satisfies an equation 1 below:

$$D1 > D2 > D3, \qquad \text{[Equation 1]}$$

wherein D1 is a thickness of the first resonance layer of the first organic light emitting element, D2 is a thickness of the second resonance layer of the second organic light emitting element, and D3 is a thickness of the third resonance layer of the third organic light emitting element.

In an embodiment, the base part and the protruding portions may be integrated with each other.

In an embodiment of the inventive concept, a display device includes a light emitting element layer, a window substrate, and a light scattering layer. The light emitting element layer includes a first electrode, a plurality of organic layers disposed on the first electrode, and an organic light emitting element including a second electrode disposed on the organic layers.

In an embodiment, the window substrate is disposed on the light emitting element layer. The light scattering layer includes a low refractive part including protruding portions directly disposed on a top surface of the window substrate and a high refractive part that is made of metal oxide and disposed to cover the protruding portions.

In an embodiment, the protruding portions protrude toward the high refractive part, are made of a polymer resin having a refractive index greater than that of the window substrate, and are randomly spaced apart from each other. Each of the protruding portions may have a height of about 200 nm or more and about 500 nm or less, and each of the protruding portions may have a width of about 50 nm or more and about 100 nm or less.

In an embodiment, the high refractive part may have a constant thickness in correspondence to a shape of the protruding portions, and the thickness may be about 20 nm or more and about 100 nm or less.

In an embodiment, the low refractive part may have a refractive index of about 1.4 or more and about 1.6 or less, and the high refractive part may have a refractive index of about 1.6 or more and about 2.5 or less.

In an embodiment, the low refractive part may further include a base part, and each of the protruding portions protrudes from the base part.

In an embodiment of the inventive concept, a method of manufacturing a display device includes: providing a light emitting element layer including a plurality of organic light emitting elements; providing a window substrate; providing a polymer resin layer on a top surface of the window substrate; forming a low refractive part including a plurality of protruding portions, which are randomly spaced apart from each other, by etching the polymer resin layer; forming a high refractive part by depositing metal oxide having a refractive index greater than that of the polymer resin layer on the protruding portions; and bonding a bottom surface of the window substrate and the light emitting element layer.

In an embodiment, the forming of the low refractive part may include etching the low refractive part by using reactive ions.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 3A and 3B are enlarged cross-sectional views illustrating region AA of FIG. 2;

FIG. 4 is an image showing a portion of a low refractive part according to an embodiment;

FIG. 5 is an enlarged cross-sectional view illustrating region BB of FIG. 3A;

FIG. 6 is a cross-sectional view illustrating a display device according to an embodiment;

FIG. 8C is a graph showing color chromaticity diagrams variation amounts of embodiments and comparative examples according to a viewing angle.

FIG. 10A is a graph showing current efficiencies of embodiments and comparative examples according to luminance.

FIG. 10C is a graph showing variation amounts of color chromaticity diagrams of embodiments and comparative examples according to a viewing angle;

FIGS. 12A to 12F are schematic views illustrating processes of manufacturing the display device according to an embodiment.

DETAILED DESCRIPTION

Figure 1:
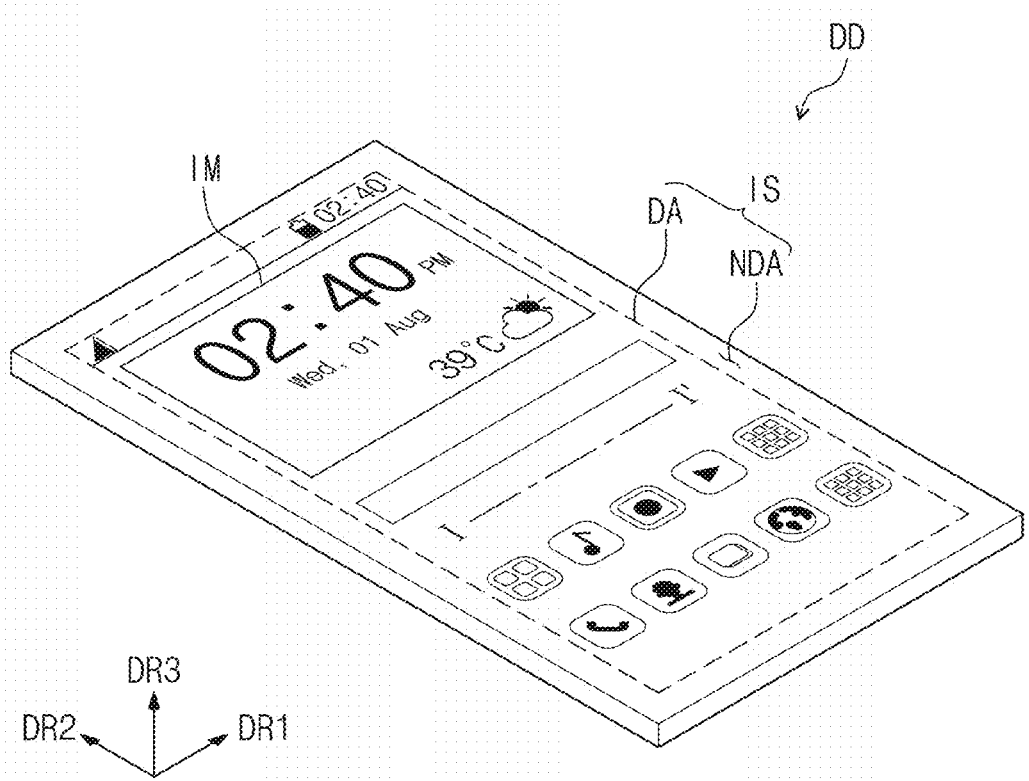
FIG. 1 is a perspective view illustrating a display device according to an embodiment.

In this specification, it will also be understood that when one component (or region, layer, portion) is referred to as being 'on', 'connected to', or 'coupled to' another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, ""under", "below", "above', "upper", and the like are used for explaining relation association of components illustrated in the drawings. The terms may be a relative concept and described based on directions expressed in the drawings.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The meaning of 'include' or 'comprise' specifies a property, a fixed number, a step, an operation, an element, a component or a combination thereof, but does not exclude other properties, fixed numbers, steps, operations, elements, components or combinations thereof.

Hereinafter, embodiments of the inventive concept will be described with reference to the accompanying drawings.

FIG. 1 is a perspective view illustrating a display device DD according to an embodiment of the inventive concept. As illustrated in FIG. 1, the display device DD may display an image IM through a display surface IS. The display surface IS is parallel to a plane defined by a first directional axis DR1 and a second directional axis DR2. A normal direction of the display surface IS, i.e., a thickness direction of the display device DD, indicates a third directional axis DR3.

A front surface (or top surface) and a rear surface (or bottom surface) of each of members is distinguished by the third directional axis DR3. However, in the embodiment, first to third directional axes DR1, DR2, and DR3 are exemplarily illustrated. Directions indicated by the first to third directional axes DR1, DR2, and DR3 may be relative concept, and converted with respect to each other. Hereinafter, the first to third directions may be directions indicated by the first to third directional axes DR1, DR2, and DR3, and designated by the same reference numerals, respectively.

Although the display module DD having a flat display surface is illustrated in an embodiment of the inventive concept, the embodiment of the inventive concept is not limited thereto. The display device DD may include a curved display surface or a three-dimensional display surface. The three-dimensional display surface may include a plurality of display areas indicating different directions from each other such as, e.g., a polygonal column type display surface.

The display device DD according to the embodiment may be a rigid display device. However, the embodiment of the inventive concept is not limited thereto. For example, the display device DD according to an embodiment of the inventive concept may be a flexible display device DD. In the embodiment, the display device DD that is applicable to a mobile terminal is exemplarily illustrated. Although not shown, a portable terminal may be configured by accommodating electronic modules, a camera module, and a power module, which are mounted on a main board, in a housing HS. The display device DD according to an embodiment of the inventive concept may be used for large-sized electronic devices such as televisions and monitors and small and medium-sized electronic devices such as mobile phones, tablet PCs, navigation units for vehicles, game consoles, and smart watches.

As illustrated in FIG. 1, the display surface IS includes a display area DA on which the image IM is displayed and a non-display area NDA disposed adjacent to the display area DA. The non-display area NDA may be an area on which an image is not displayed. FIG. 1 illustrates icon images as an example of the image IM.

As illustrated in FIG. 1, the display area DA may have a rectangular shape. The non-display area NDA may surround the display area DA. However, the embodiment of the inventive concept is not limited thereto. For example, the display area DA and the non-display area NDA may be relatively designed in shape.

Figure 2:
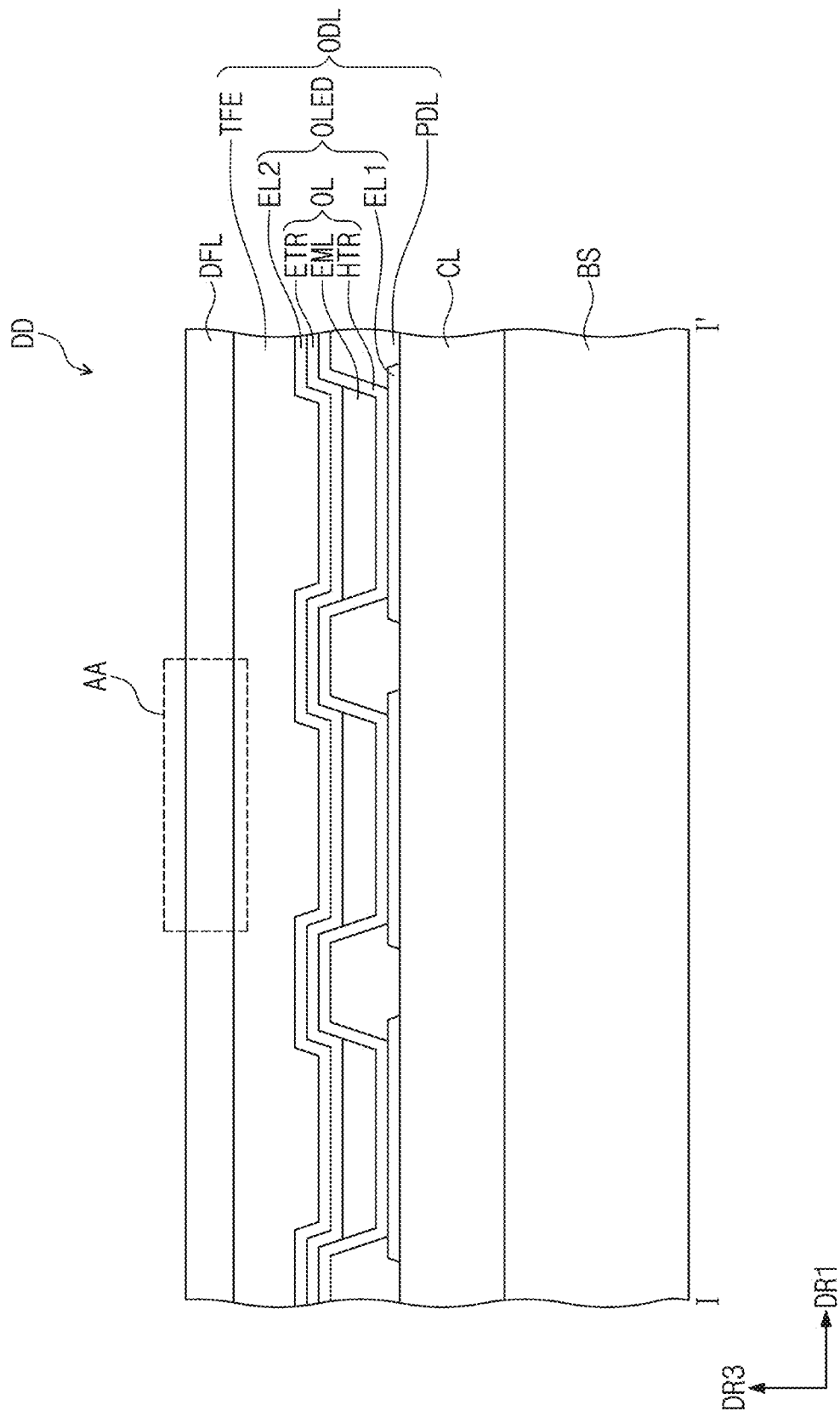
FIG. 2 is a cross-sectional view taken along line I-I' of FIG. 1.

FIG. 2 is a cross-sectional view taken along line I-I' of FIG. 1.

The display device DD according to an embodiment may include a light emitting element layer ODL and a light scattering layer DFL. Although the light scattering layer DFL may be directly disposed on the light emitting element layer ODL, the embodiment of the inventive concept is not limited thereto. For example, another component may be further disposed between the light scattering layer DFL and the light emitting element layer ODL. For example, a window substrate WD may be further provided therebetween. Detailed descriptions will be described later.

Although not shown, other components such as a cover member (not shown) may be further disposed on the light scattering layer DFL.

The light emitting element layer ODL may include a plurality of pixel defining layers PDL disposed on a circuit layer CL, a plurality of organic light emitting elements OLED, and a thin-film encapsulation layer TFE disposed on the organic light emitting elements OLED. In this specification, an expression of "on a plane" may represent a state in which the display device DD is viewed in the third direction DR3 (thickness direction).

Each of the organic light emitting elements OLED may include a first electrode EL1, a plurality of organic layers OL disposed on the first electrode ELL and a second electrode EL2 disposed on the plurality of organic layers OL. The organic layers OL may include a hole transporting region HTR disposed on the first electrode EL1, a light emitting layer EML disposed on the hole transporting region HTR, and an electron transporting region ETR disposed on the light emitting layer EML. The thin-film encapsulation layer TFE may be directly disposed on the second electrode EL2.

The first electrode EL1 has conductivity. The first electrode EL1 may be made of a metal alloy or a conductive compound. The first electrode EL1 may be an anode. Also, the first electrode EL1 may be a pixel electrode. The first electrode EL1 may be a transmissive electrode, a transflective electrode, or a reflective electrode. When the first electrode EL1 is the transmissive electrode, the first electrode EL1 may include metal oxide such as, e.g., indium tin oxide (ITO), indium zinc oxide (IZO), zinc oxide (ZnO), or indium tin zinc oxide (ITZO). When the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, or a compound or a mixture (e.g., a mixture of Ag and Mg) thereof. Alternatively, the first electrode EL1 may have a multi-layered structure including a reflective layer or a transflective layer, which is made of the above-described materials, and a transparent conductive layer made of indium tin oxide (ITO), indium zinc oxide (IZO), zinc oxide (ZnO), or indium tin zinc oxide (ITZO). For example, the first electrode EL1 may have a three-layered structure of ITO/Ag/ITO. However, the embodiment of the inventive concept is not limited thereto.

The hole transporting region HTR may include at least one of a hole injection layer, a hole transporting layer, a hole buffer layer, and an electron blocking layer. The hole transporting region HTR may have a single layer structure made of a single material, a single layer structure made of a plurality of materials, which are different from each other, or a multi-layered structure including a plurality of layers made of a plurality of materials, which are different from each other.

The light emitting layer EML may have a single layer structure made of a single material, a single layer structure made of a plurality of materials, which are different from each other, or a multi-layered structure including a plurality of layers made of a plurality of materials, which are different from each other.

The electron transporting region ETR may be disposed on the light emitting layer EML. The electron transporting region ETR may include at least one of a hole blocking layer, an electron transporting layer, and an electron injection layer. However, the embodiment of the inventive concept is not limited thereto. The electron transporting region ETR may have a single layer structure made of a single material, a single layer structure made of a plurality of materials, which are different from each other, or a multi-layered structure including a plurality of layers made of a plurality of materials, which are different from each other. The embodiment of the inventive concept is not particularly limited to the material of the electron transporting region ETR. For example, the electron transporting region ETR may include a well-known material in the art.

The embodiment of the inventive concept is not particularly limited to the material of the above-described organic layers OL. For example, each of the organic layers OL may be made of a well-known material in the art without limitation.

The second electrode EL2 may be disposed on the electron transporting region ETR. The second electrode EL2 may be a common electrode or negative electrode. The second electrode EL2 may be a transmissive electrode, a transflective electrode, or a reflective electrode. When the second electrode EL2 is the transmissive electrode, the second electrode EL2 may be made of metal oxide such as, e.g., indium tin oxide (ITO), indium zinc oxide (IZO), zinc oxide (ZnO), or indium tin zinc oxide (ITZO).

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, or a compound or a mixture (e.g., a mixture of Ag and Mg) thereof. Alternatively, the second electrode EL2 may have a multi-layered structure including a reflective layer or a transflective layer, which is made of the above-described materials, and a transparent conductive layer made of indium tin oxide (ITO), indium zinc oxide (IZO), zinc oxide (ZnO), or indium tin zinc oxide (ITZO).

Although not shown, the second electrode EL2 may be connected to an auxiliary electrode. When the second electrode EL2 is connected to the auxiliary electrode, resistance of the second electrode EL2 may be reduced.

The light emitting element layer ODL may be disposed on the circuit layer CL including a plurality of transistors (not shown). The organic light emitting elements OLED may be electrically connected to the plurality of transistors (not shown), respectively, to receive a signal. The circuit layer CL may be disposed on a base substrate BS.

FIGS. 3A and 3B are enlarged cross-sectional view illustrating region AA of FIG. 2.

Referring to FIG. 3A, the light scattering layer DFL may further include a low refractive part LRL and a high refractive part HRL directly disposed on the low refractive part LRL. The low refractive part LRL may include a plurality of protruding portions PT. The protruding portions PT may protrude toward the high refractive part HRL.

Although the protruding portions PT have the same size and are regularly arranged in FIGS. 3A and 3B, the embodiment of the inventive concept is not limited thereto. For example, the protruding portions PT may have the different sizes from each other and be randomly spaced apart from each other in the first direction DR1.

The high refractive part HRL may cover the protruding portions PT. Since the high refractive part HRL covers the protruding portions PT, the high refractive part HRL may have a protruding shape corresponding to that of the protruding portions PT. The high refractive part HRL may be a planarization layer for planarizing the protruding portions PT. In this case, since the high refractive part HRL is necessary to be thickly deposited, a light transmittance may be reduced.

Referring to FIG. 3B, a low refractive part LRL1 may further include a base part BL disposed directly below the protruding portions PT. Each of the protruding portions PT may protrude from the base part BL. The protruding portions PT and the base part BL may be integrated with each other. That is, the protruding portions PT and the base part BL may be one component having an integrated shape. The protruding portions PT and the base part BL may be made of the same material.

The low refractive part LRL may include at least one of poly(methyl methacrylate) (PMMA), SU-8, polyvinyl alcohol (PVA), polyethylene terephthalate (PET), polyethersulfone (PES), and polyethylene naphthalate (PEN). SU-8 represents a polymer resin in which epoxy monomers, which are expressed by chemical formula 1, are polymerized.

[chemical formula 1]

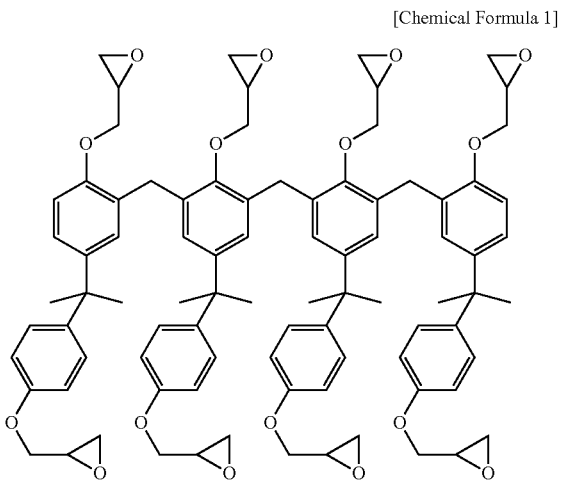 [SMILES: CC(C)(c1ccc(OCC2CO2)cc1)c1ccc(OCC2CO2)c(Cc2cc(C(C)(C)c3ccc(OCC4CO4)cc3)cc(Cc3cc(C(C)(C)c4ccc(OCC5CO5)cc4)cc(Cc4cc(C(C)(C)c5ccc(OCC6CO6)cc5)ccc4OCC4CO4)c3OCC3CO3)c2OCC2CO2)c1]

[Chemical Formula 1]

The monomers, which are expressed by the chemical formula 1, undergo a polymerization reaction to generate SU-8. For example, when a proper amount of acid catalyst is applied, epoxy groups, which are disposed adjacent to each other, react as described below and are cross-linked to provide SU-8 as shown in chemical formula 2.

[chemical formula 2]

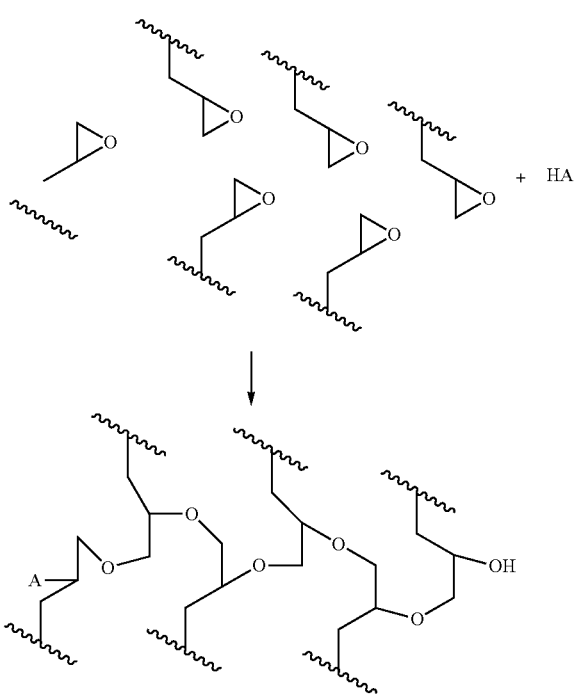

The low refractive part LRL may include one or multiple of the above-described materials. For example, the low refractive part LRL may include PMMA. However, the embodiment of the inventive concept is not limited thereto. For example, the low refractive part LRL may include a polymer resin that is typically used in the art.

The high refractive part HRL may include at least one of $Al_2O_3$, MgO, $ZrO_2$, ZnO, $TiO_2$, aluminum zinc oxide (AZO), indium tin oxide (ITO), and Indium zinc oxide (IZO). The high refractive part HRL may include one or multiple of the above-described materials. For example, the high refractive part HRL may include one of ZnO and $Al_2O_3$.

The low refractive part LRL may have a refractive index equal to or greater than that of a component directly disposed therebelow. For example, when the low refractive part LRL is directly disposed on the thin-film encapsulation layer TFE, the low refractive part LRL may have a refractive index equal to or greater than that of the thin-film encapsulation layer TFE. A difference between the refractive indexes of the low refractive part LRL and the thin-film encapsulation layer TFE may be about 0.2 or less. More specifically, the difference between the refractive indexes of the low refractive part LRL and the thin-film encapsulation layer TFE may be about 0.1 or less.

For example, the thin-film encapsulation layer TFE may have a refractive index of about 1.2 or more and about 1.5 or less, and the low refractive part LRL may have a refractive index of about 1.4 or more and about 1.6 or less. However, the embodiment of the inventive concept is not limited thereto. For example, the refractive indexes of the thin-film encapsulation layer TFE and the low refractive part LRL may be varied according to materials thereof.

As the low refractive part LRL has the refractive index equal to or greater than that of the thin-film encapsulation layer TFE. Therefore, at the interface between the low refractive index portion LRL and the thin film encapsulation layer TFE, the rate at which light emitted from the light emitting element layer ODL is total-reflected decreases. Accordingly, the luminance and light output efficiency of the display device DD according to an embodiment may improve.

A light transmittance of the light scattering layer DFL in a wavelength of about 400 nm or more and about 780 nm or less in a visible light region may be about 80% or more. When the light transmittance of the light scattering layer DFL is less than about 80%, an effect of increasing in light output efficiency caused by the light extraction effect of the light scattering layer DFL may be reduced.

The high refractive part HRL may have a refractive index greater than that of the low refractive part LRL. For example, the high refractive part HRL may have a refractive index greater than that of the low refractive part LRL in a range of about 0.2 or more and about 1 or less. For example, the low refractive part LRL may have a refractive index of about 1.4 or more and about 1.6 or less, and the high refractive part HRL may have a refractive index of about 1.6 or more and about 2.5 or less. However, the embodiment of the inventive concept is not limited thereto. For example, the refractive indexes of the low refractive part LRL and the high refractive part HRL may be varied according to materials thereof.

While the light emitted from the light emitting element layer ODL is transmitted through an interface between the protruding portions PT of the low refractive part LRL and the high refractive part HRL, the light may be scattered in various directions due to the protruding shape of the protruding portions PT and the difference between the refractive indexes of the low refractive part LRL and the high refractive part HRL. When the difference between the refractive indexes of the low refractive part LRL and the high refractive part HRL is equal to or less than about 0.2, light scattering may not be easily generated, and when equal to or greater than about 1.0, an amount of light that is total-reflected may increase to reduce the light output efficiency.

In the display device DD according to an embodiment, since the high refractive part HRL also has the protruding shape corresponding that of the protruding portions PT, the light may be scattered again while being transmitted through the high refractive part HRL.

In the display device DD according to an embodiment, since the light scattering is generated two times while being transmitted through the low refractive part LRL and the high refractive part HRL, the light may be scattered in various directions. Accordingly, the viewing angle of the display device DD according to an embodiment may be widened, and the visibility thereof may improve. In particular, an effect of improvement in viewing angle may be greater than when a top surface of the high refractive part HRL has a flat shape.

FIG. 4 is an image showing a portion of the low refractive part LRL according to an embodiment, which is enlarged by a scanning electron microscope (SEM). The low refractive part LRL according to an embodiment may be manufactured by using PMMA. The protruding portions PT may have a size, a density, and a shape, which are varied depending on a material used in manufacturing of the low refractive part LRL and a difference in process conditions.

FIG. 5 is an enlarged cross-sectional view illustrating region BB of FIG. 3A. In FIG. 5, two protruding portions PT and the high refractive part HRL disposed on the protruding portions PT are illustrated.

According to an embodiment, the protruding portions PT may have each independently a height L1 of about 200 nm or more and about 500 nm or less. The protruding portions PT may have a mean height of about 200 nm or more and about 500 nm or less. The height L1 of the protruding portion PT may represent a minimum distance between a top surface of the thin-film encapsulation layer TFE and an uppermost portion of the protruding portion PT. When the base part BL is disposed below the protruding portion PT, the height L1 of the protruding portion PT may represent a minimum distance between a top surface of the base part BL and the uppermost portion of the protruding portion PT.

The protruding portions PT may have each independently a width L2 of about 50 nm or more and about 100 nm or less. The protruding portions PT may have a mean height of about 50 nm or more and about 100 nm or less. The width L2 of the protruding portion PT may represent a maximum distance of distances of the protruding portions PT, which is measured in parallel to the first direction DR1. When a linear distance in parallel to the first direction DR1 is measured, since a bottom surface of each of the protruding portions PT has a maximum distance in FIG. 3, a width of the bottom surface of the protruding portion PT is defined as a width of the protruding portion PT. However, the embodiment of the inventive concept is not limited thereto. For example, when another portion of the protruding portion PT has a maximum linear distance, the width of the protruding portion PT may represent a linear distance of the another portion.

A spaced distance L3 between the protruding portions PT may be equal to or greater than about 10 nm and equal to or less than about 100 nm. An average of spaced distances L3 between the protruding portions PT may be equal to or greater than about 10 nm and equal to or less than about 100 nm. The spaced distance L3 between the protruding portions PT may be defined as a spaced distance between bottom surfaces of the protruding portions PT.

When the height L1 and the width L2 of each of the protruding portions PT satisfy the above-described range, output light may be scattered in a wider range. When the height L1 and the width L2 of each of the protruding portions PT exceed the range, and the spaced distance L3 is less than the range, as the scattering range of the light is narrowed, the effect of improvement in viewing angle may be reduced. When the height L1 and the width L2 of each of the protruding portions PT are less than the range, and the spaced distance L3 exceeds the range, as a density of the protruding portions PT decreases, a scattered light amount may decrease, and the effect of improvement in viewing angle may be reduced.

The high refractive part HRL may have a thickness of about 20 nm or more and about 100 nm or less. The high refractive part HRL may be deposited on the low refractive part LRL with a constant thickness. When the high refractive part HRL has a thickness of 20 nm or less, distribution of the high refractive part HRL may be ununiform, and thus the light scattering range may be narrowed to reduce the effect of improvement in viewing angle. When the high refractive part HRL has a thickness greater than about 100 nm, a total transmitted light amount may decrease to reduce luminance.

FIG. 6 is a cross-sectional view illustrating the display device according to an embodiment. The cross-sectional view of FIG. 6 may correspond to a cross-section taken along line I-I' of the display device in FIG. 1.

Referring to FIG. 6, a window substrate WD may be further provided between the light emitting element layer ODL and the light scattering layer DFL. The light scattering layer DFL may be directly disposed on a top surface WD-US of the window substrate WD.

The window substrate WD may protect the display device DD from an external impact and provide an input surface to a user. The window substrate WD may include glass or plastic. The window substrate WD may have a transparent property so that light generated from the light emitting element layer ODL is transmitted therethrough. The window substrate WD may be a rigid substrate. However, the embodiment of the inventive concept is not limited thereto. For example, the window substrate WD may be a flexible substrate.

The low refractive part may have a refractive index equal to or greater than that of the window substrate WD. A difference between the refractive indexes of the low refractive part LRL and the window substrate WD may be about 0.2 or less. Specifically, the difference between the refractive indexes of the low refractive part LRL and the window substrate WD may be about 0.1 or less.

Figure 7:
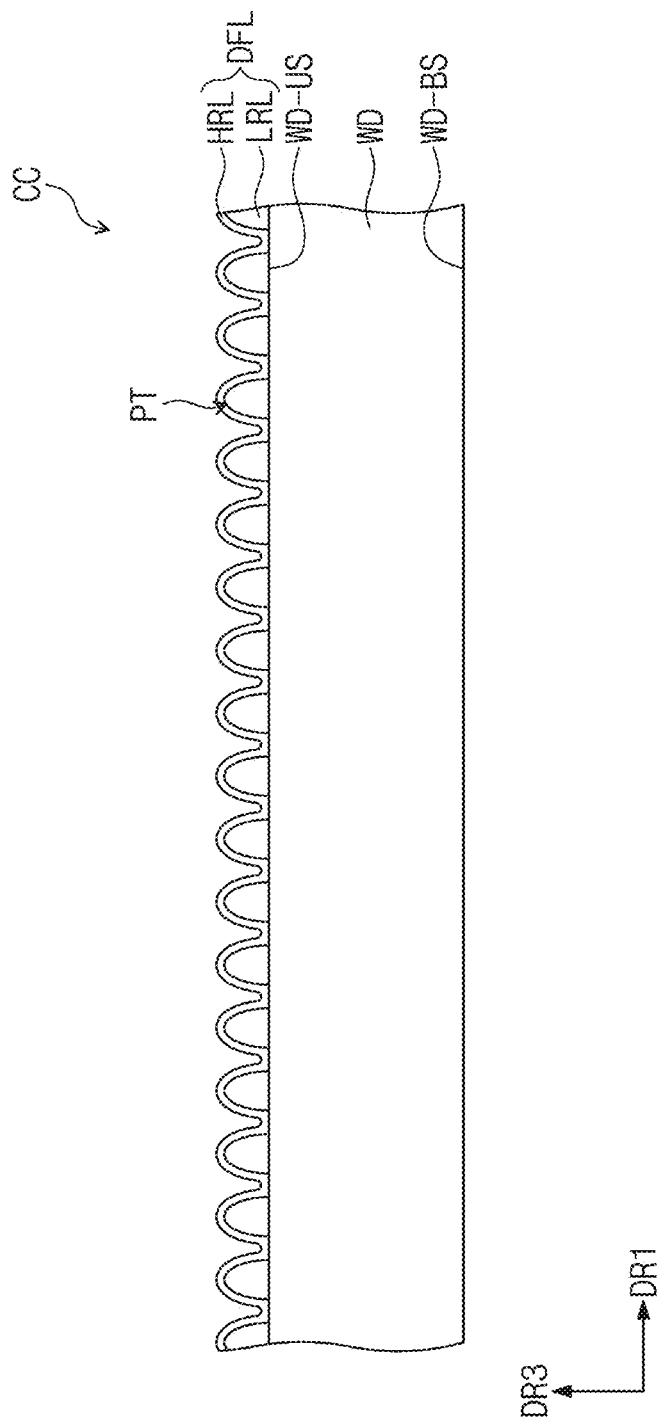
FIG. 7 is an enlarged cross-sectional view illustrating region CC of FIG. 6.

FIG. 7 is an enlarged cross-sectional view illustrating region CC of FIG. 6. Referring to FIG. 7, the protruding portions PT may be directly disposed on the top surface WD-US of the window substrate WD. Although not shown, a base part BL (refer to FIG. 3B) may be further provided below the protruding portions PT.

Figure 8A:
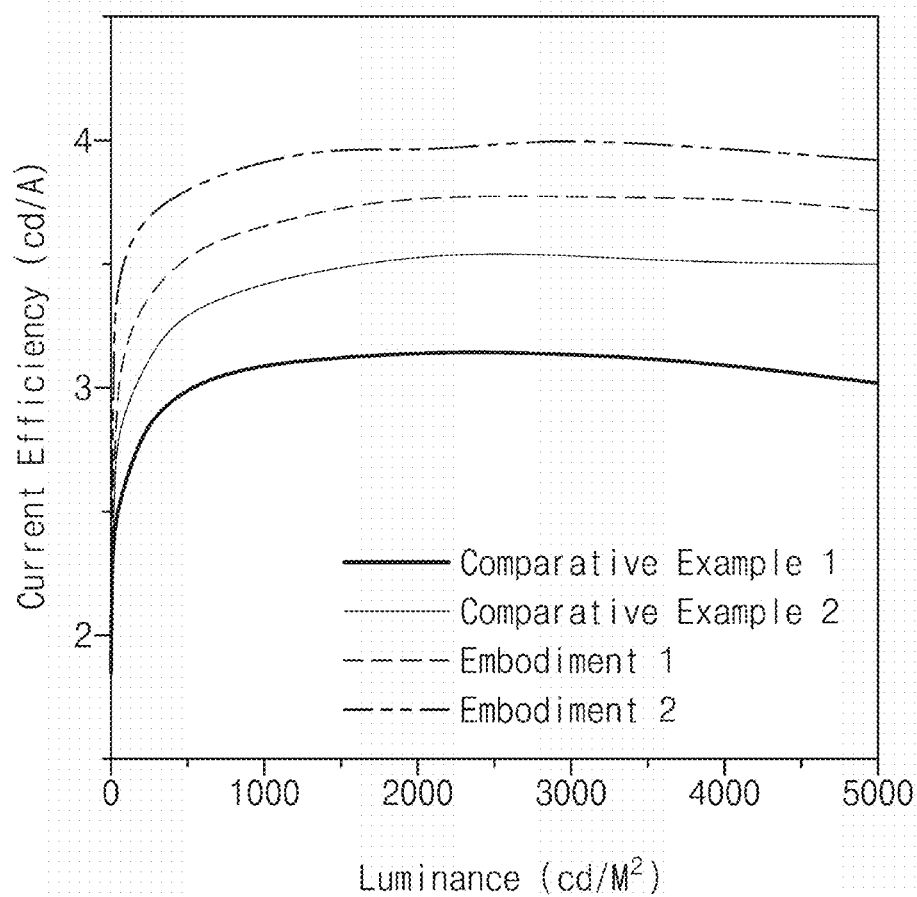
FIG. 8A is a graph showing current efficiencies of embodiments and comparative examples according to luminance thereof.
Figure 8B:
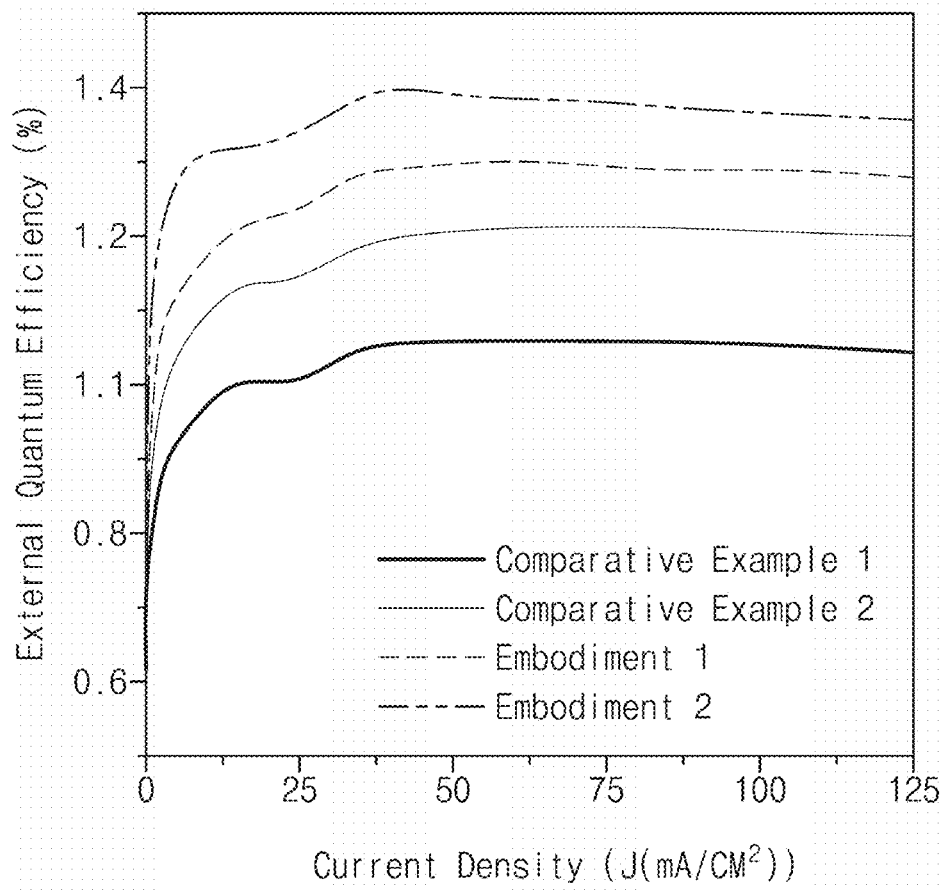
FIG. 8B is a graph showing quantum efficiencies of embodiments and comparative examples according to a current density.

FIG. 8A is a graph showing current efficiencies of embodiments and comparative examples according to luminance. FIG. 8B is a graph showing quantum efficiencies of embodiments and comparative examples according to a current density. FIG. 8C is a graph showing variation amounts of color chromaticity diagrams of embodiments and comparative examples according to a viewing angle. FIG. 8C shows the variation amounts (Δuv) of the color chromaticity diagrams, which is varied according to a viewing angle on the basis of CIE 1976 color chromaticity diagrams.

The organic light emitting elements OLED of an embodiment 1, an embodiment 2, a comparative example 1, and a comparative example 2 include the first electrode EL1 made of ITO. The hole injection layer is made of HAT-CN (dipyrazino[2,3-f:2',3'-h] quinoxaline-2,3,6,7,10,11-hexacarbonitrile), and the hole transporting layer is made of NPB(N,N'-di(naphthalene-1-yl)-N,N'-diphenyl-benzidine). The light emitting layer EML is made of $Alq_3$(tris(8-hydroxyquinolino)aluminum), and the electron injection layer is made of LiF. The second electrode EL2 is made of Al. The organic light emitting element OLED is manufactured by using the first electrode EL1 as a transmissive electrode and the second electrode EL2 as a reflective electrode.

The window substrate WD having a refractive index of about 1.4 is disposed on the organic light emitting element OLED in the embodiment 1, the embodiment 2, the comparative example 1, and the comparative example 2. In the embodiment 1 and the embodiment 2, the light scattering layer DFL is disposed on the top surface WD-US of the window substrate WD. In the embodiment 1 and the embodiment 2, the low refractive part LRL is made of PMMA. In the embodiment 1, the high refractive part HRL made of $Al_2O_3$ is disposed on the low refractive part LRL. In the embodiment 2, the high refractive part HRL made of ZnO is disposed on the low refractive part LRL. In the comparative example 1, the light scattering layer DFL is not provided. In the comparative example 2, only the low refractive part LRL is disposed without the high refractive part HRL.

In the embodiment 1, the low refractive part LRL has a refractive index of about 1.5, and the high refractive part HRL has a refractive index of about 1.7. In the embodiment 2, the low refractive part LRL has a refractive index of about 1.5, and the high refractive part HRL has a refractive index of about 1.9. In the comparative example 2, the low refractive part LRL has a refractive index of about 1.5.

In the embodiment 1, a light transmittance of the light scattering layer DFL on the basis of a wavelength of about 540 nm is about 87.2%, and in the embodiment 2, a light transmittance of the light scattering layer DFL on the basis of a wavelength of about 540 nm is about 86.1%. All of the embodiment 1 and the embodiment 2 show a transmittance of about 80% or more in a wavelength of a visible light region, which is about 400 nm or more and about 780 nm or less.

Referring to FIGS. 8A to 8C, the embodiment 1 and the embodiment 2, in which the light scattering layer DFL is provided, show a current efficiency, an external quantum efficiency, and an effect of improvement in viewing angle, which are greater than those in the comparative example 1 and the comparative example 2.

Figure 9:
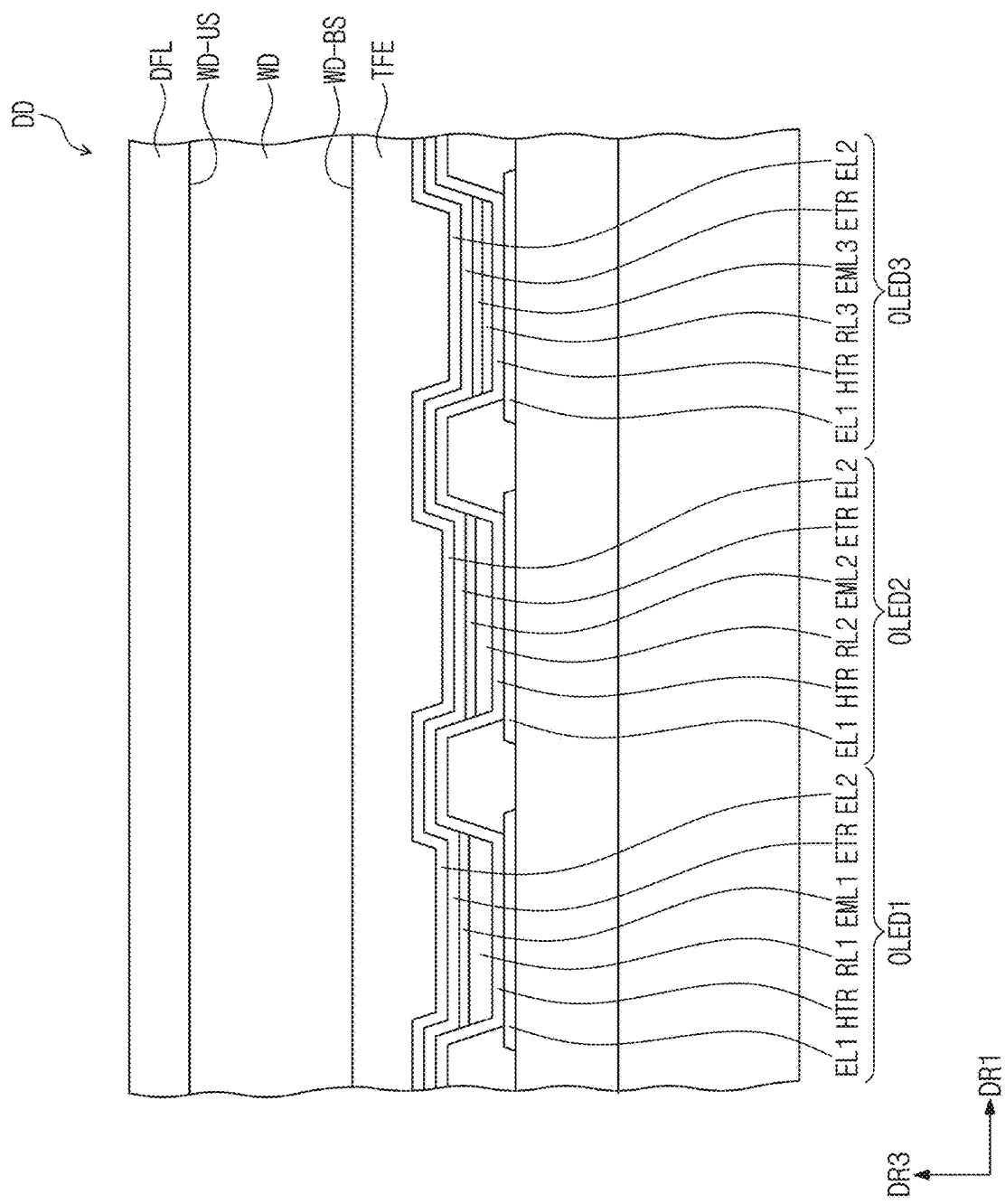
FIG. 9 is a cross-sectional view illustrating a display device according to an embodiment.

FIG. 9 is a cross-sectional view illustrating a display device according to an embodiment. The cross-sectional view of FIG. 9 may correspond to a cross-section taken along line I-I' of the display device in FIG. 1.

Referring to FIG. 9, a first organic light emitting element OLED to a third organic light emitting element OLED may further include resonance layers RL1, RL2, and RL3 disposed directly below light emitting layers EML1, EML2, and EML3, respectively. The first organic light emitting element OLED to the third organic light emitting element OLED may be substantially the same as the organic light emitting element OLED in FIG. 2 except further including the resonance layers RL1, RL2, and RL3 disposed directly below the light emitting layers EML1, EML2, and EML3, respectively. Although not shown, the resonance layers RL1, RL2, and RL3 may be disposed directly on the light emitting layers EML1, EML2, and EML3 according to structures of the organic light emitting elements OLED1, OLED2, and OLED3.

Each of the resonance layers RL1, RL2, and RL3 may be an organic layer for adjusting a resonance distance. When the resonance layers RL1, RL2, and RL3 are disposed between the light emitting layers EML1, EML2, and EML3 and the first electrode EL1, the resonance layers RL1, RL2, and RL3 may include a well-known hole transporting material. When the resonance layers RL1, RL2, and RL3 are disposed between the light emitting layers EML1, EML2, and EML3 and the second electrode EL2, the resonance layers RL1, RL2, and RL3 may include a well-known electron transporting material.

Each of the resonance layers RL1, RL2, and RL3 may have a height that is adjusted according to a light emitting wavelength of light emitted from the light emitting layer. When each of the light emitting layers EML1, EML2, and EML3 emits light having a short wavelength distance, each of the resonance layers RL1, RL2, and RL3 may have a relatively short length, and when each of the light emitting layers EML1, EML2, and EML3 emits light having a long wavelength distance, each of the resonance layers RL1, RL2, and RL3 may have a relatively long length. For example, when the first organic light emitting element OLED1 emits red light, the second organic light emitting element OLED2 emits green light, and the third organic light emitting element OLED3 emits blue light, a thickness of each of the resonance layers RL1, RL2, and RL3 in the first to third resonance layers OLED1, OLED2, and OLED3 may satisfy the equation 1 below.

$$D1>D2>D3, \quad \text{[Equation 1]}$$

wherein D1 is a thickness of the resonance layer RL1 of the first organic light emitting element OLED1, D2 is a thickness of the resonance layer RL2 of the second organic light emitting element OLED2, and D3 is a thickness of the resonance layer RL3 of the third organic light emitting element OLED3.

Although not shown, the resonance layer RL3 may be omitted from the third organic light emitting element OLED3. That is, D3 may be about 0.

As the thickness of each of the resonance layers RL1, RL2, and RL3 is adjusted, the resonance distance of each of the organic light emitting elements OLED1, OLED2, and OLED3 may be adjusted to improve the light output efficiency. However, the embodiment of the inventive concept is not limited thereto. For example, the thickness of each of the resonance layers RL1, RL2, and RL3 may be variously adjusted according to a color of light emitted from the light emitting layers EML1, EML2, and EML3.

Figure 10B:
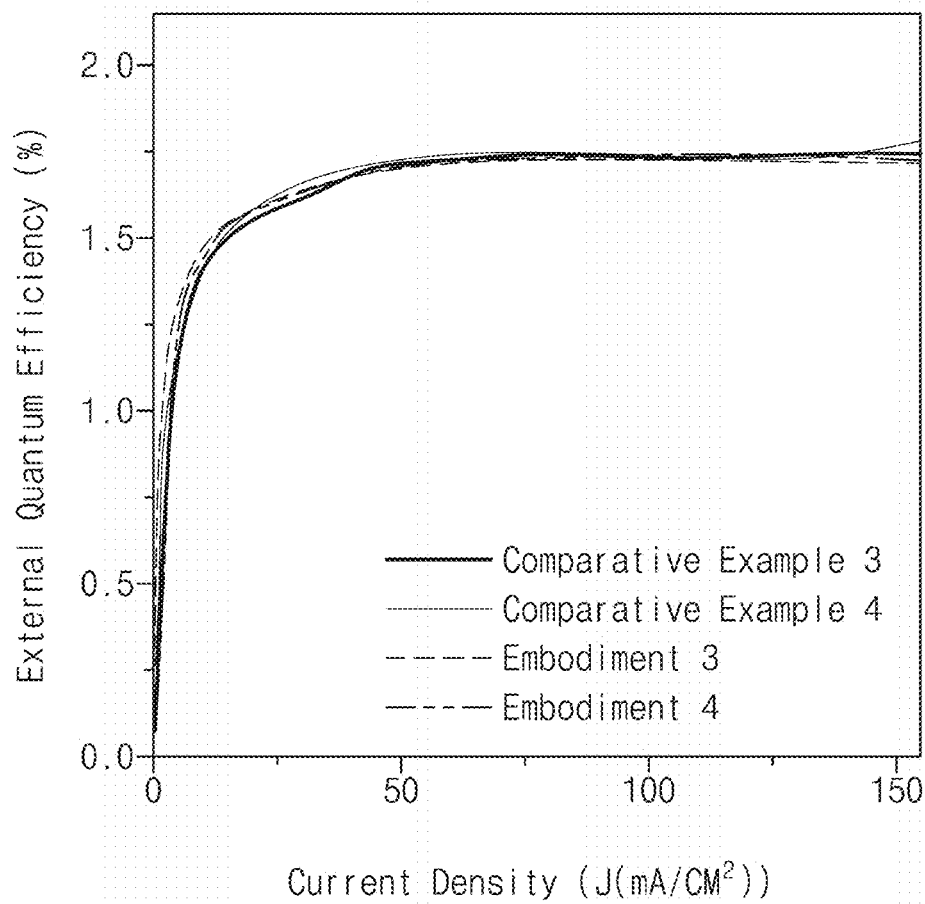
FIG. 10B is a graph showing external quantum efficiencies of embodiments and comparative examples according to a current density.

FIG. 10A is a graph showing current efficiencies of embodiments and comparative examples according to luminance. FIG. 10B is a graph showing external quantum efficiencies of embodiments and comparative examples according to a current density. FIG. 10C is a graph showing variation amounts of color chromaticity diagrams of embodiments and comparative example according to a viewing angle. FIG. 10C shows the variation amounts (Δuv) of the color chromaticity diagrams, which are varied according to a viewing angle on the basis of CIE 1976 color chromaticity diagrams.

The organic light emitting elements OLED of an embodiment 3, an embodiment 4, a comparative example 3, and a comparative example 4 include the first electrode EL1 made of ITO. The hole injection layer is made of Ag, and the hole transporting layer is made of HAT-CN(dipyrazino[2,3-f:2', 3'-h] quinoxaline-2,3,6,7,10,11-hexacarbonitrile). The resonance layer RL is made of NPB(N,N'-di(naphthalene-1-yl)-N,N'-diphenyl-benzidine) that is used as the hole transporting material. The light emitting layer EML emitting green light is made of Alq$_3$(tris(8-hydroxyquinolino)aluminum), and the electron injection layer is made of LiF. The second electrode EL2 is made of Al. The organic light emitting element OLED is manufactured by using the first electrode EL1 as a transmissive electrode and the second electrode EL2 as a reflective electrode.

Besides the above-described features, embodiments 3 and 4 perform experiments under the same conditions as the embodiments 1 and 2, and comparative examples 3 and 4 perform experiments under the same conditions as the comparative examples 1 and 2.

Referring to FIGS. 10A and 10B, a current efficiency of each of the embodiments 3 and 4 is less than that of each of the comparative examples 3 and 4, and an external quantum efficiency of each of the embodiments 3 and 4 is similar to that of each of the comparative examples 3 and 4. The current efficiency is a value obtained by being measured with respect to luminance of light output in a front direction, and the external quantum efficiency is a value obtained by measuring light output in a front direction. While the current efficiency value of each of the embodiments 3 and 4, which are measured in the front, is less than that of each of the comparative examples 3 and 4 due to a light scattering effect caused by the light scattering layer DFL, the external quantum efficiency of each of the embodiments 3 and 4, which are measured in the front, is similar to that of each of the comparative examples 3 and 4. Accordingly, reduction in light output amount due to the light scattering layer DFL is insignificant. Here, since the light output efficiency already improves by adding the resonance layer RL that improves the light extraction efficiency in the embodiments 3 and 4, additional improvement in light output efficiency like that in embodiments 1 and 2 is insignificant.

Referring to FIG. 10C, the embodiments 3 and 4, in which the light scattering layer DFL is provided, show the effect of improvement in viewing angle, which is greater than that of the comparative examples 3 and 4.

Figure 11:
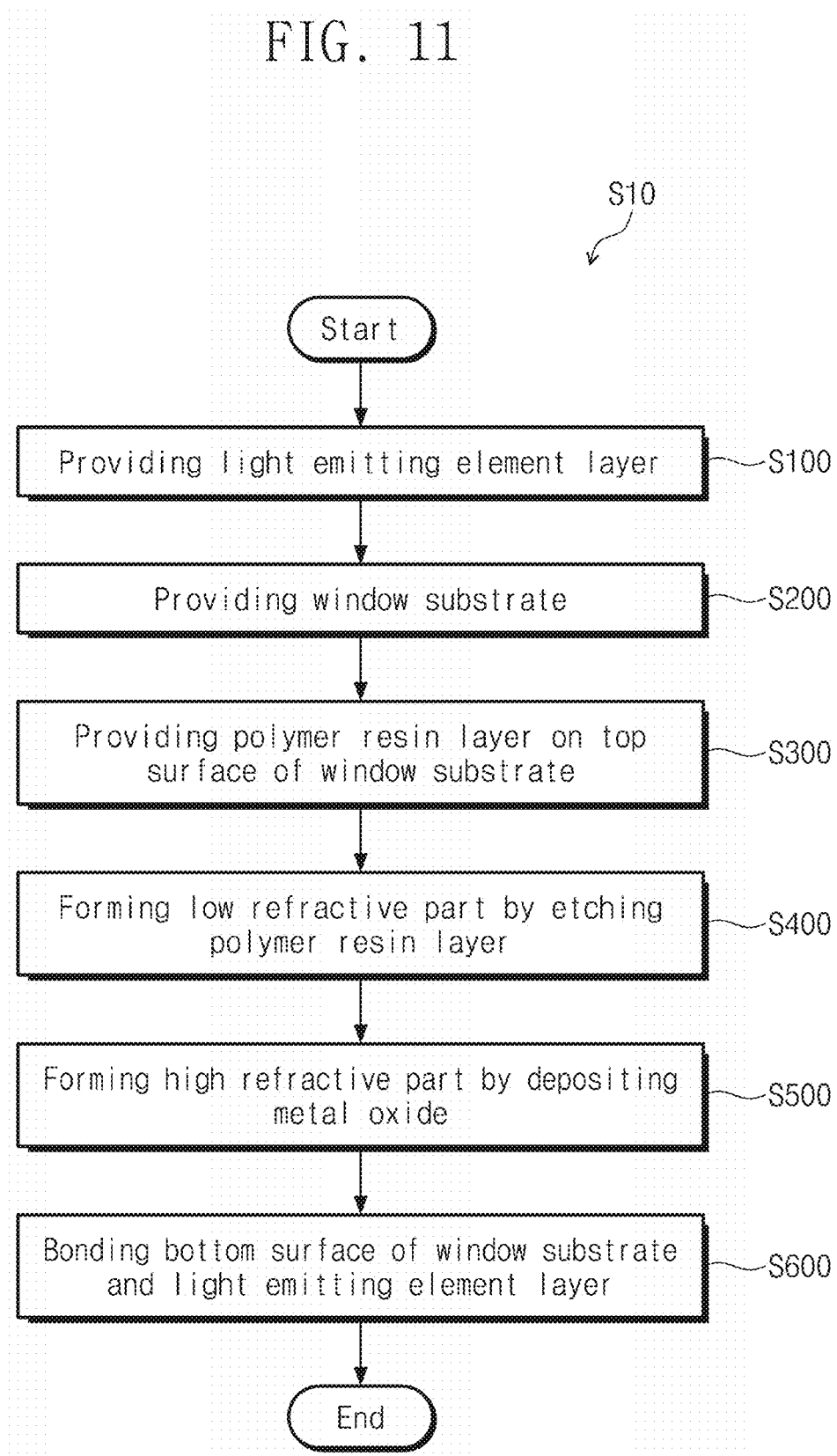
FIG. 11 is a flowchart showing representing a method of manufacturing a display device according to an embodiment.

FIG. 11 is a flowchart representing a method S10 of manufacturing the display device DD according to an embodiment.

Referring to FIG. 11, the method S10 of manufacturing the display device DD according to an embodiment may include: a process S100 of providing a light emitting element layer ODL; a process S200 of providing a window substrate WD; a process S300 of providing a polymer resin layer RS on a top surface WD-US of the window substrate WD; a process S400 of forming a low refractive part LRL by etching the polymer resin layer RS; a process S500 of providing a high refractive part HRL by depositing metal oxide; and a process S600 of bonding the light emitting element layer ODL and a bottom surface WD-BS of the window substrate WD.

FIGS. 12A to 12F are schematic views illustrating processes of manufacturing the display device according to an embodiment.

Figure 12A:
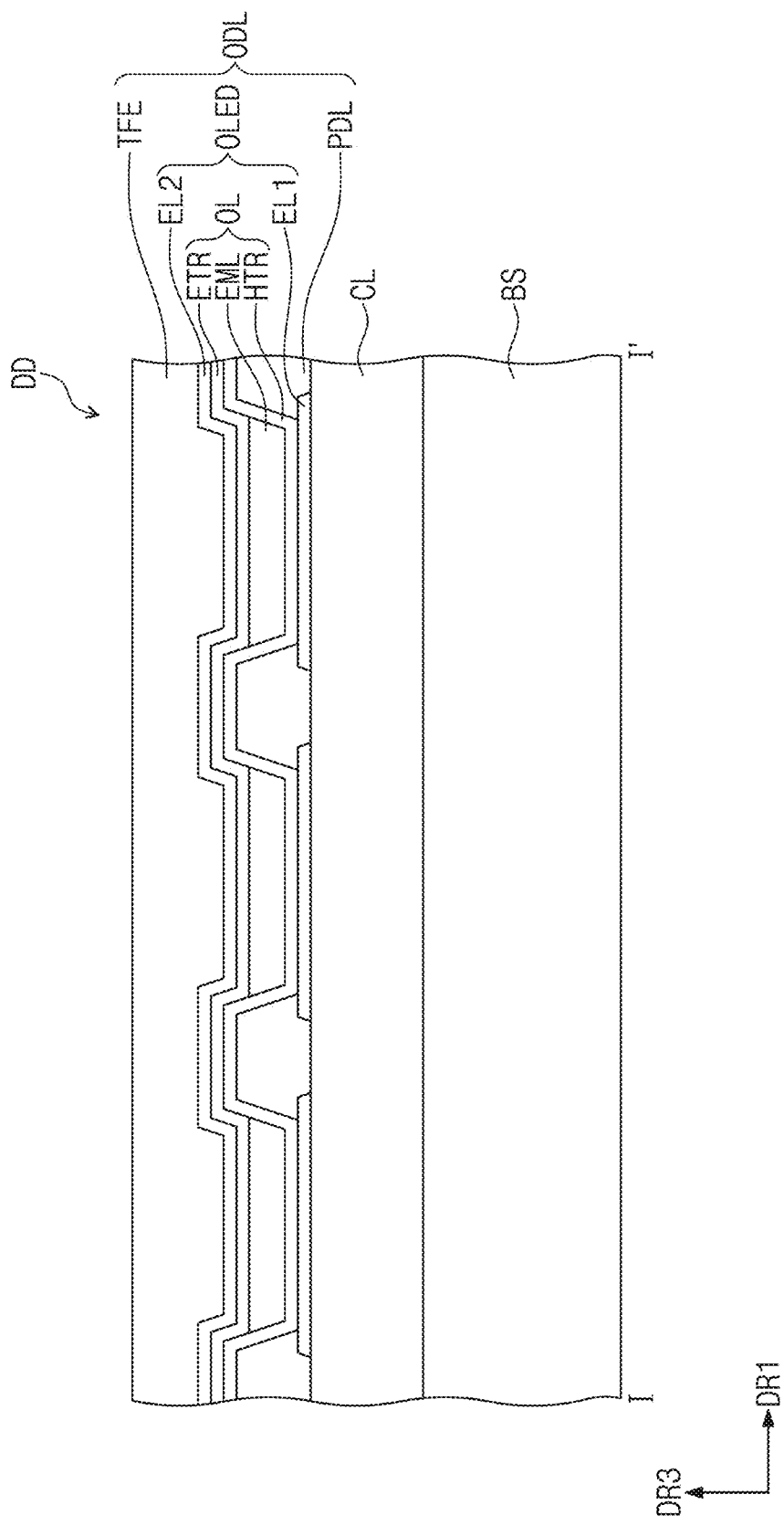
Figure 12B:
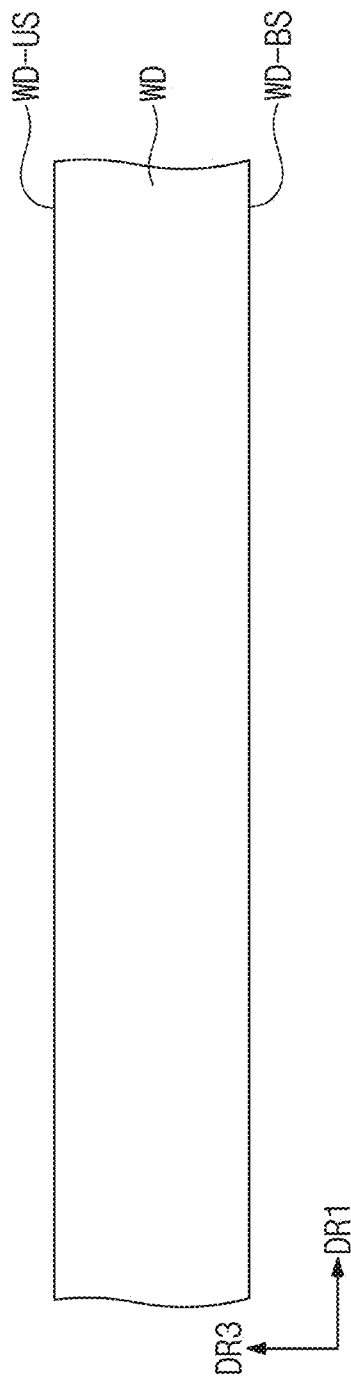
Figure 12C:
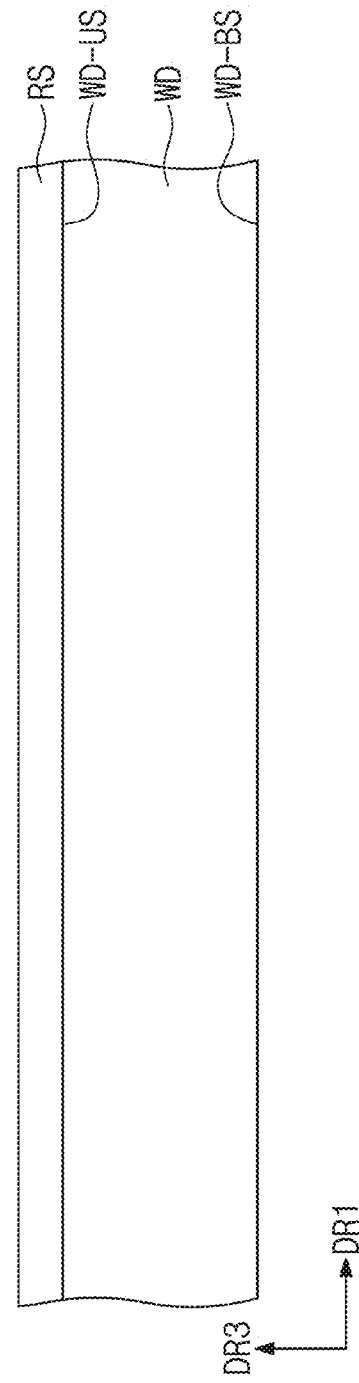

FIG. 12A is a view illustrating the process S100 of providing a light emitting element layer ODL. The light emitting element layer ODL in FIG. 12A may further include the above-described resonance layer RL.

FIGS. 12 B and 12C are views illustrating the process S200 of providing a window substrate WD and the process S300 of providing a polymer resin layer RS on a top surface WD-US of the window substrate WD, respectively.

The polymer resin is provided on the top surface WD-US of the window substrate WD, and then uniformly applied on the top surface WD-US of the window substrate WD. However, the embodiment of the inventive concept is not particularly limited to the coating method of the polymer resin. For example, the polymer resin may be applied by a well-known method in the art. For example, the polymer resin may be applied by using a spin-coating method. In this case, a spin speed (RPM) may be adjusted according to a size of a substrate, a thickness of the polymer resin layer RS to be fabricated, and a viscosity and a density of the polymer resin. The applied polymer resin undergoes a curing process and then forms the polymer resin layer RS.

FIG. 12D is a view illustrating the process S400 of forming a low refractive part LRL by etching the polymer resin layer RS. FIG. 12D exemplarily illustrates the process of forming the low refractive part LRL by using reactive ion etching. As reactive ions RI collide with the polymer resin layer RS to generate a volatile reaction product, the polymer resin layer RS may be etched, and the low refractive part LRL may be formed. However, the embodiment of the inventive concept is not limited thereto. For example, the low refractive part LRL may be formed by using another well-known etching method in the art.

When the polymer resin layer RS is etched by the reactive ion etching, the low refractive part LRL having protruding portions PT, which are randomly spaced apart from each other and have different sizes from each other, may be formed. Although not shown, the low refractive part LRL in which a base part BL is further provided below the protruding portions PT may be formed by adjusting a degree of etching.

Figure 12E:
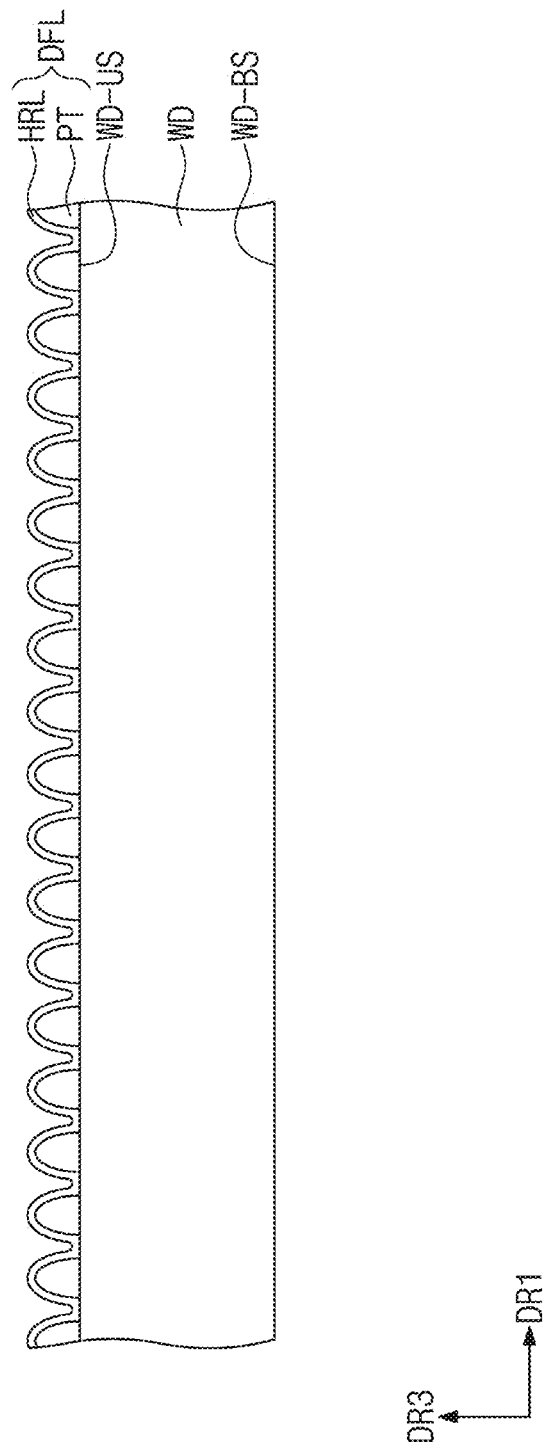

FIG. 12E is a view illustrating the process S500 of providing a high refractive part HRL by depositing metal oxide.

The embodiment of the inventive concept is not particularly limited to the method of depositing metal oxide. For example, the metal oxide may be deposited by a chemical vapor deposition (CVD) method or a physical vapor deposition (PVD) method, and more particularly, a sputtering method. The metal oxide may be deposited on the low refractive part LRL with a substantially constant thickness. Accordingly, the metal oxide may be deposited in a protruding shape corresponding that of the protruding portions PT.

FIG. 12F is a view illustrating the process S600 of bonding the light emitting element layer ODL and a bottom surface WD-BS of the window substrate WD. Although not shown, an optically clear adhesive may be disposed between the window substrate WD and the light emitting element layer ODL.

The light scattering layer DFL according to an embodiment may include the low refractive part LRL including a plurality of protruding portions PT and the high refractive part HRL covering the protruding portions PT.

As the light scattering layer DFL is disposed, the display device DD according to an embodiment may improve in light output efficiency and improve in viewing angle.

The display device manufactured by the method S10 of manufacturing the display device DD according to an embodiment may have the improved light output efficiency and the improved viewing angle.

According to the embodiment of the inventive concept, the display device having the improved light output efficiency and the manufacturing method thereof may be provided.

According to the embodiment of the inventive concept, the display device having the improved viewing angle and the manufacturing method thereof may be provided.

It will be apparent to those skilled in the art that various modifications and variations can be made in the inventive concept. Thus, it is intended that the present disclosure covers the modifications and variations of this invention provided they come within the scope of the appended claims and their equivalents. Thus, to the maximum extent allowed by law, the scope of the present invention is to be determined by the broadest permissible interpretation of the following claims and their equivalents, and shall not be restricted or limited by the foregoing detailed description.

What is claimed is:

1. A display device comprising:
   a light emitting element layer comprising a plurality of organic light emitting elements and a thin-film encapsulation layer disposed on the organic light emitting elements; and
   a light scattering layer disposed on the light emitting element layer,
   wherein the light scattering layer comprises:
      a low refractive part comprising a plurality of protruding portions and made of a polymer resin; and
      a high refractive part covering the protruding portions and having a refractive index greater than that of the low refractive part,
      wherein the high refractive part has a constant thickness and a protruding shape corresponding to that of the protruding portions of the low refractive part.

2. The display device of claim 1, wherein the low refractive part further comprises a base part, and each of the protruding portions protrudes in a direction from the base part toward the high refractive part.

3. The display device of claim 2, wherein the base part and the protruding portions are integrated with each other.

4. The display device of claim 1, wherein the low refractive part has a refractive index of about 1.4 or more and about 1.6 or less,
   the high refractive part has a refractive index of about 1.6 or more and about 2.5 or less, and
   a difference between refractive indexes of the high refractive part and the low refractive part is about 0.2 or more and about 1 or less.

5. The display device of claim 1, wherein the low refractive part comprises at least one of poly (methyl methacrylate) (PMMA), SU-8, polyvinyl alcohol (PVA), polyethylene terephthalate (PET), polyethersulfone (PES), and polyethylene naphthalate (PEN), and
   the high refractive part comprises at least one of $Al_2O_3$, MgO, $ZrO_2$, ZnO, $TiO_2$, aluminum zinc oxide (AZO), indium tin oxide (ITO), and indium zinc oxide (IZO).

6. The display device of claim 1, wherein the low refractive part comprises PMMA, and
   the high refractive part comprises ZnO or $Al_2O_3$.

7. The display device of claim 1, wherein each of the protruding portions has a height of about 200 nm or more and about 500 nm or less, and
   each of the protruding portions has a width of about 50 nm or more and about 100 nm or less.

8. The display device of claim 1, wherein the high refractive part has a thickness of about 20 nm or more and about 100 nm or less.

9. The display device of claim 1, wherein a mean spaced distance between the protruding portions is about 10 nm or more and about 100 nm or less.

10. The display device of claim 1, wherein the light scattering layer has a light transmittance of about 80% or more in a wavelength range of about 400 nm or more and about 780 nm.

11. The display device of claim 1, further comprising a window substrate disposed between the thin-film encapsulation layer and the light scattering layer, wherein the light scattering layer is directly disposed on a top surface of the window substrate.

12. The display device of claim 11, wherein the low refractive part has a refractive index equal to or greater than that of the window substrate, and a difference between refractive indexes of the low refractive part and the window substrate is about 0.2 or less.

13. The display device of claim 1, wherein the organic light emitting elements, which are spaced apart from each other on a plane, comprise: a first organic light emitting element comprising a first light emitting layer configured to emit red light; a second organic light emitting element comprising a second light emitting layer configured to emit green light; and a third organic light emitting element comprising a third light emitting layer configured to emit blue light, the first to third organic light emitting elements comprise first to third resonance layers directly disposed on the first to third light emitting layers, respectively, and each of the first to third resonance layers has a thickness that satisfies an equation 1 below:

$$D1 > D2 > D3, \quad \text{[Equation 1]}$$

wherein D1 is a thickness of the first resonance layer of the first organic light emitting element, D2 is a thickness of the second resonance layer of the second organic light emitting element, and D3 is a thickness of the third resonance layer of the third organic light emitting element.

14. A display device comprising:

a light emitting element layer comprising a first electrode, a plurality of organic layers disposed on the first electrode, and an organic light emitting element comprising a second electrode disposed on the organic layers;

a window substrate disposed on the light emitting element layer; and a light scattering layer comprising a low refractive part comprising protruding portions directly disposed on a top surface of the window substrate and a high refractive part that is made of metal oxide and disposed to cover the protruding portions, wherein the protruding portions protrude toward the high refractive part, are made of a polymer resin having a refractive index greater than that of the window substrate, and are randomly spaced apart from each other, and wherein the high refractive part has a constant thickness and a protruding shape corresponding to that of the protruding portions of the low refractive part.

15. The display device of claim 14, wherein each of the protruding portions has a height of about 200 nm or more and about 500 nm or less, and each of the protruding portions has a width of about 50 nm or more and about 100 nm or less.

16. The display device of claim 14, wherein the low refractive part has a refractive index of about 1.4 or more and about 1.6 or less, and the high refractive part has a refractive index of about 1.6 or more and about 2.5 or less.

17. The display device of claim 14, wherein the low refractive part further comprises a base part, and each of the protruding portions protrudes from the base part.

* * * * *